(12) United States Patent
Kaigawa et al.

(10) Patent No.: US 8,193,687 B2
(45) Date of Patent: Jun. 5, 2012

(54) PIEZOELECTRIC/ELECTROSTRICTIVE CERAMICS SINTERED BODY HAVING A BANDED STRUCTURE

(75) Inventors: Kazuyuki Kaigawa, Aichi (JP); Ritsu Tanaka, Aichi (JP); Hirofumi Yamaguchi, Aichi (JP)

(73) Assignee: NGK Insulators, Ltd., Nagoya (JP)

( * ) Notice: Subject to any disclaimer, the term of this patent is extended or adjusted under 35 U.S.C. 154(b) by 445 days.

(21) Appl. No.: 12/508,870

(22) Filed: Jul. 24, 2009

(65) Prior Publication Data
US 2010/0019624 A1    Jan. 28, 2010

(30) Foreign Application Priority Data

Jul. 28, 2008 (JP) ................... 2008-193384
Jul. 2, 2009 (JP) ................... 2009-157557

(51) Int. Cl.
*H01L 41/187* (2006.01)

(52) U.S. Cl. ............. 310/358; 501/134; 252/62.9 R; 252/62.9 PZ

(58) Field of Classification Search .......... 310/358; 252/62.9 R, 62.9 PZ; 501/134–135
See application file for complete search history.

(56) References Cited

U.S. PATENT DOCUMENTS

| | | | | |
|---|---|---|---|---|
| 7,893,601 B2* | 2/2011 | Kaigawa et al. | ............ | 310/358 |
| 7,911,117 B2* | 3/2011 | Yamaguchi et al. | ......... | 310/357 |
| 7,956,518 B2* | 6/2011 | Ozawa et al. | ............... | 310/358 |
| 8,034,249 B2* | 10/2011 | Kaigawa et al. | ........ | 252/62.9 PZ |
| 2006/0006360 A1 | 1/2006 | Takao et al. | | |
| 2006/0091588 A1 | 5/2006 | Nakamura et al. | | |
| 2008/0152581 A1 | 6/2008 | Kaigawa et al. | | |
| 2011/0003206 A1* | 1/2011 | Yura et al. | ..................... | 429/224 |
| 2011/0012051 A1* | 1/2011 | Kaigawa et al. | ......... | 252/62.9 R |
| 2011/0156540 A1* | 6/2011 | Hatano et al. | ................ | 310/366 |

FOREIGN PATENT DOCUMENTS

JP    2008-078267    4/2008

* cited by examiner

*Primary Examiner* — Jaydi San Martin

(74) *Attorney, Agent, or Firm* — Burr & Brown

(57) ABSTRACT

An alkali niobate-based piezoelectric/electrostrictive ceramics sintered body including, as a main crystal phase, a perovskite type oxide containing at least one type of element selected from the group consisting of Li, Na and K as A site constituent elements and at least one type of element selected from the group consisting of Nb and Ta as B site constituent elements. The number of lattice-strained layers of the piezoelectric/electrostrictive ceramics sintered body is preferably small. A diffuse scattering intensity ratio, which is a ratio of an intensity of diffuse scattering by a lattice-strained layer present near a domain wall to a sum of an X-ray diffraction intensity of a first lattice plane and that of a second lattice plane different in interplanar spacing from the first lattice plane due to crystallographic symmetry reduction is preferably 0.5 or lower.

13 Claims, 25 Drawing Sheets

F I G . 1
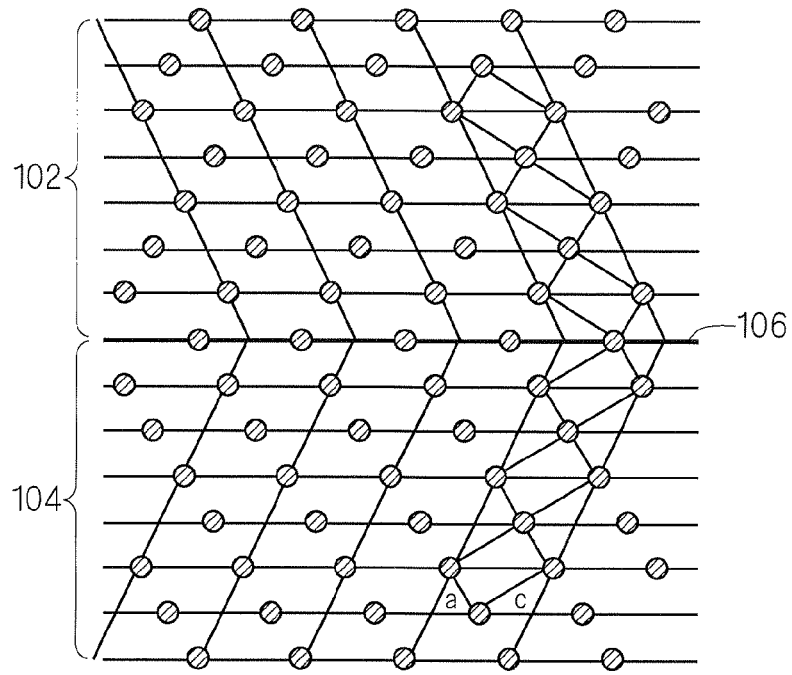
F I G . 2
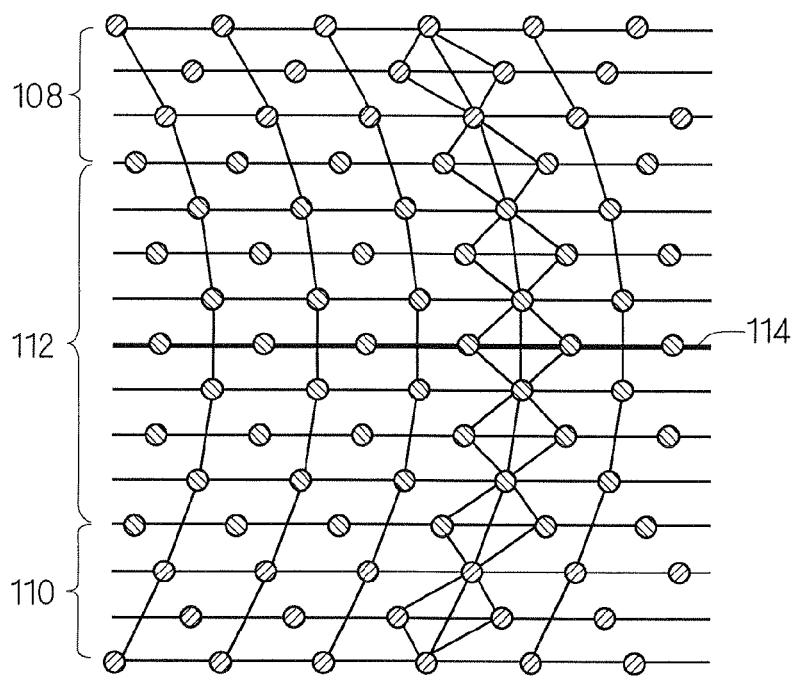

F I G . 4
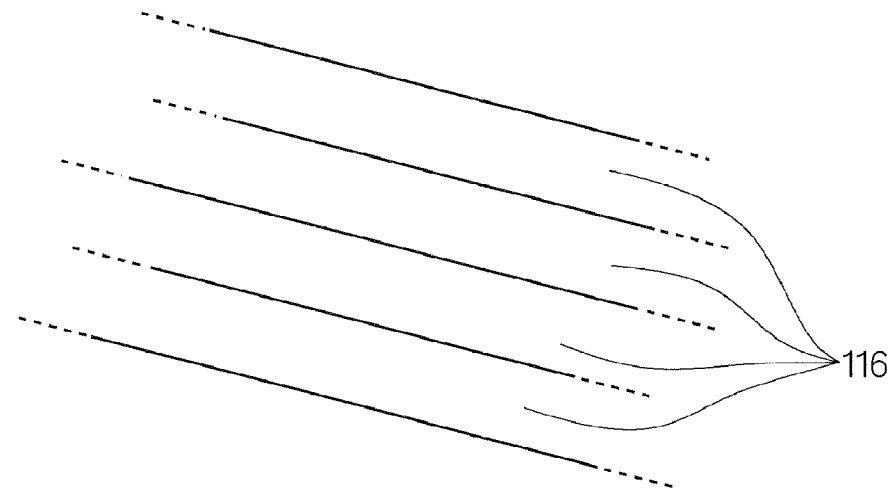
F I G . 5
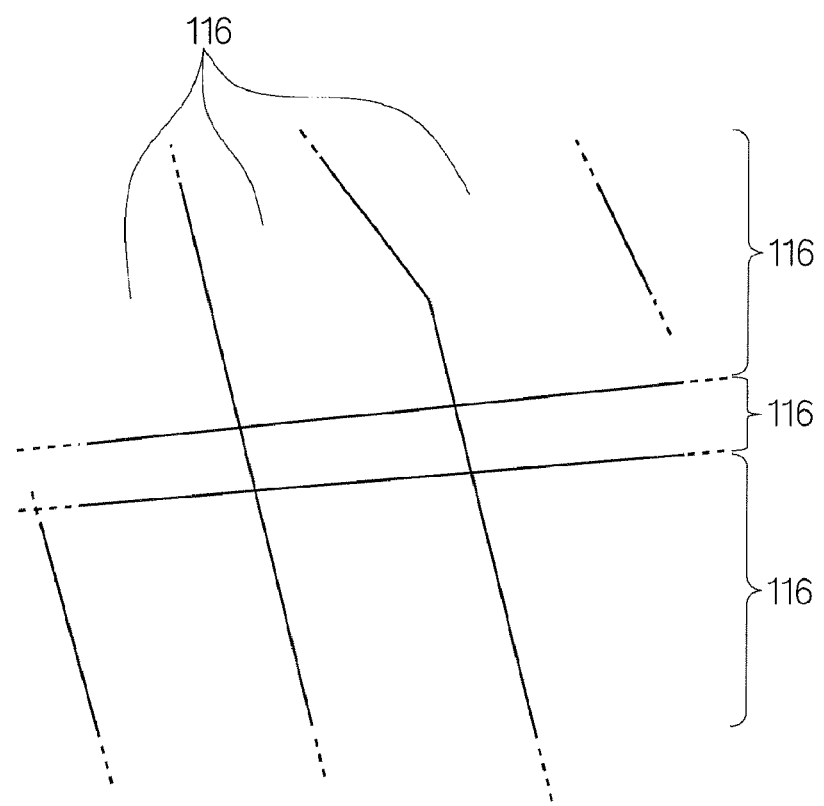

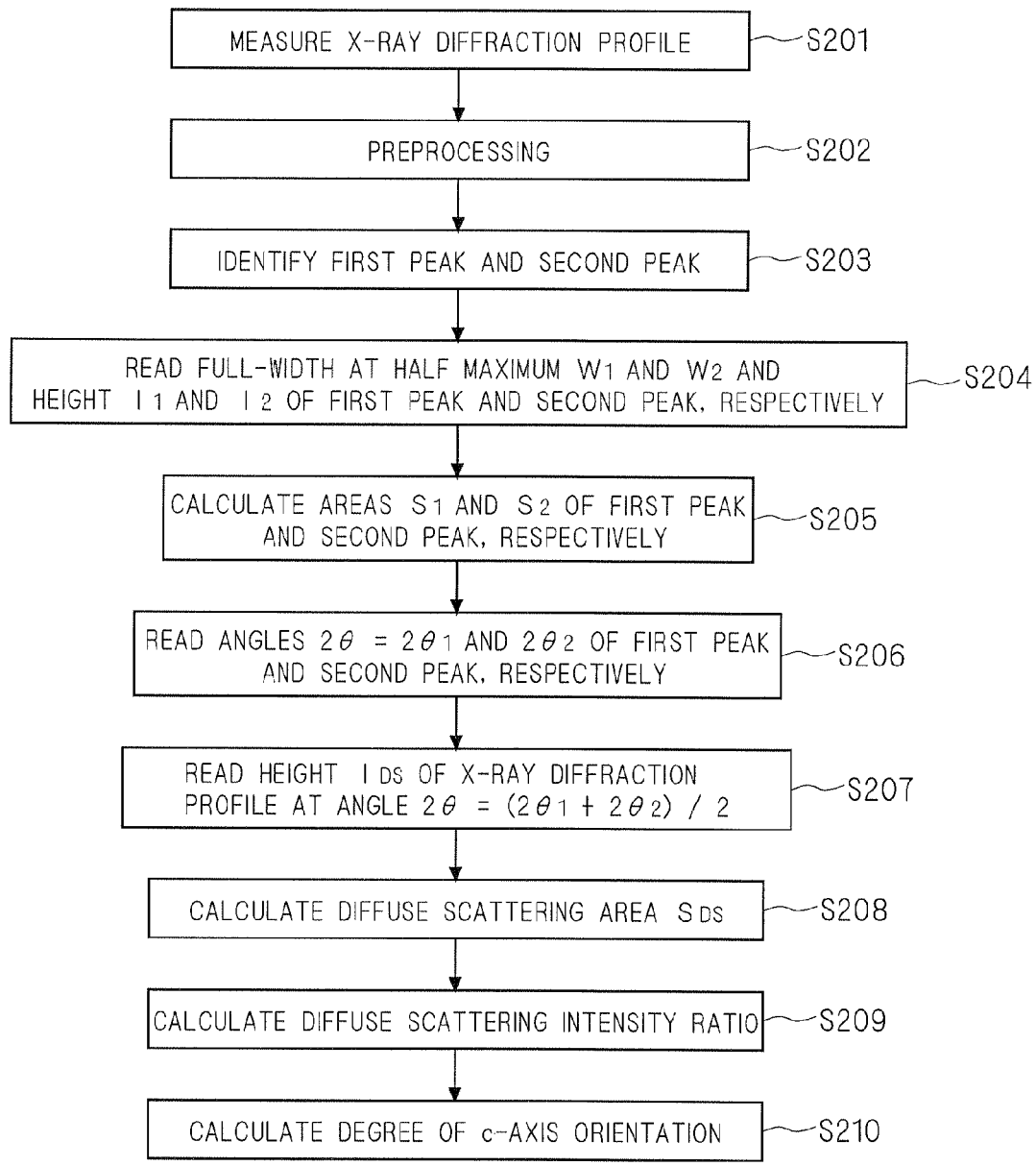
F I G . 6

F I G . 1 0
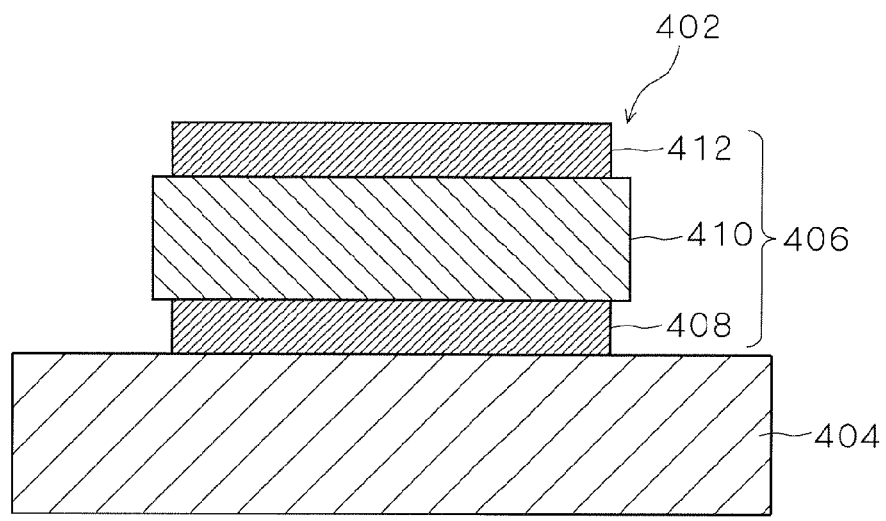
F I G . 1 1
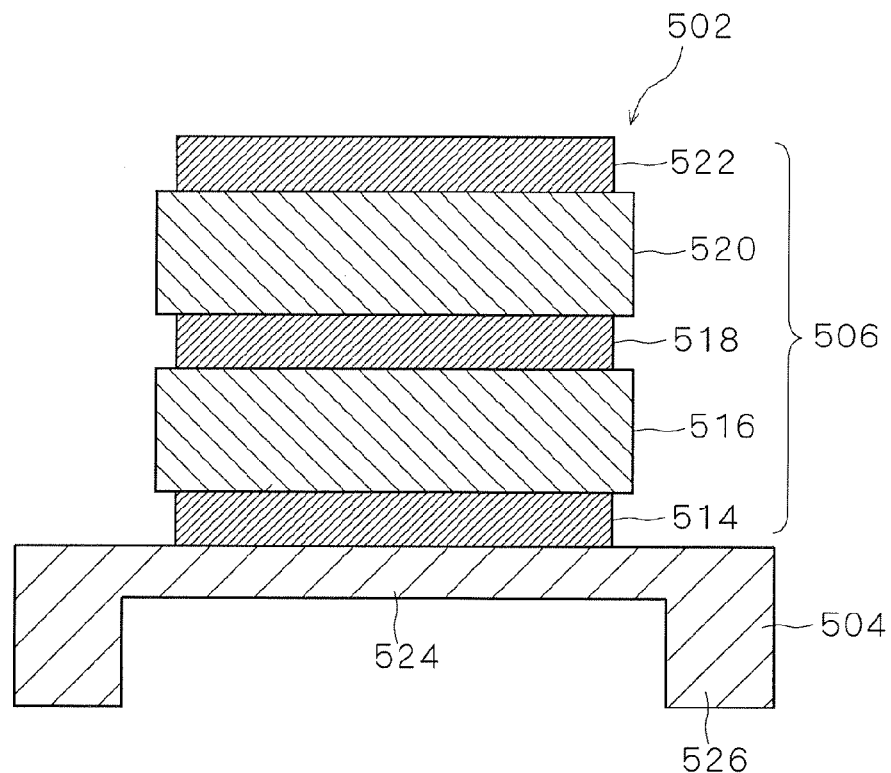

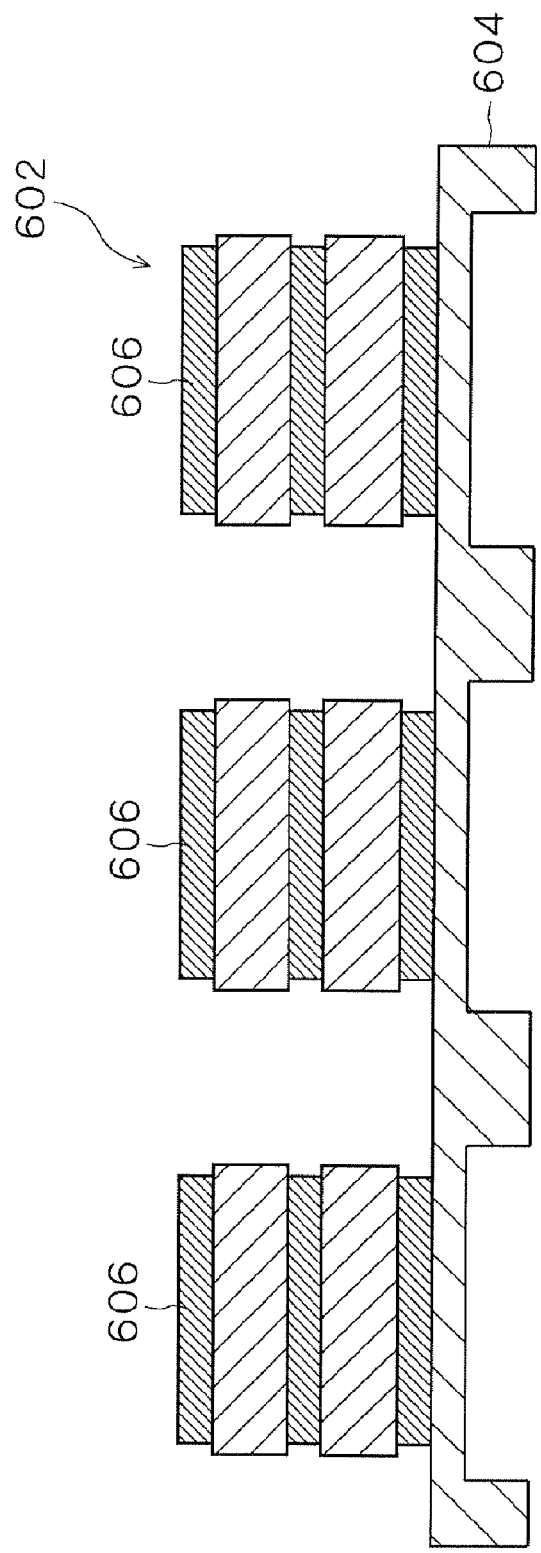

F I G . 1 3
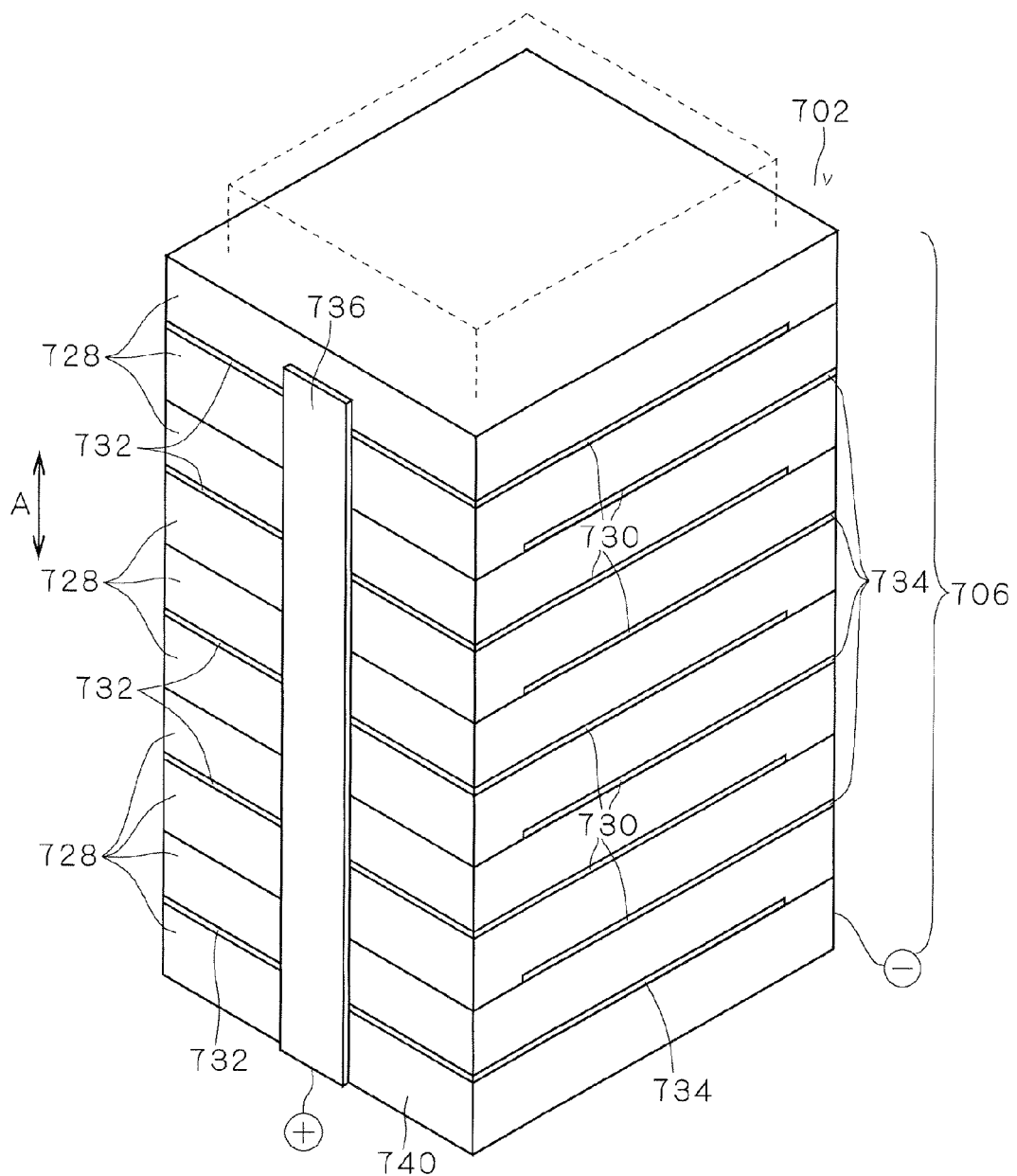

FIG. 17

| | COMPARATIVE EXAMPLE 1 | EXAMPLE 1 | EXAMPLE 2 |
|---|---|---|---|
| TREATMENT CONDITIONS IN FIRING KEEP STEP | NON | 850°C×3h. | 850°C×10h. |
| DIFFUSE SCATTERING INTENSITY RATIO | 0.51 | 0.39 | 0.20 |
| DEGREE OF c-AXIS ORIENTATION | 4.0 | 4.4 | 4.8 |
| RATIO OF BANDED STRUCTURE OCCUPYING IN GRAINS [%] | 0 | 4 | 80 |
| WIDTH OF NON-180° DOMAINS [μm] | 0.1~0.7 | 0.1~0.7 / 1~4 | 0.1~0.4 / 1~10 |
| RELATIVE DIELECTRIC CONSTANT ε | 845 | 907 | 1006 |
| $d_{31}$ [pm/V] | 72 | 83 | 87 |
| tan δ [%] | 1.4 | 1.0 | 0.9 |
| S4000 [ppm] | 510 | 608 | 702 |

FIG. 21
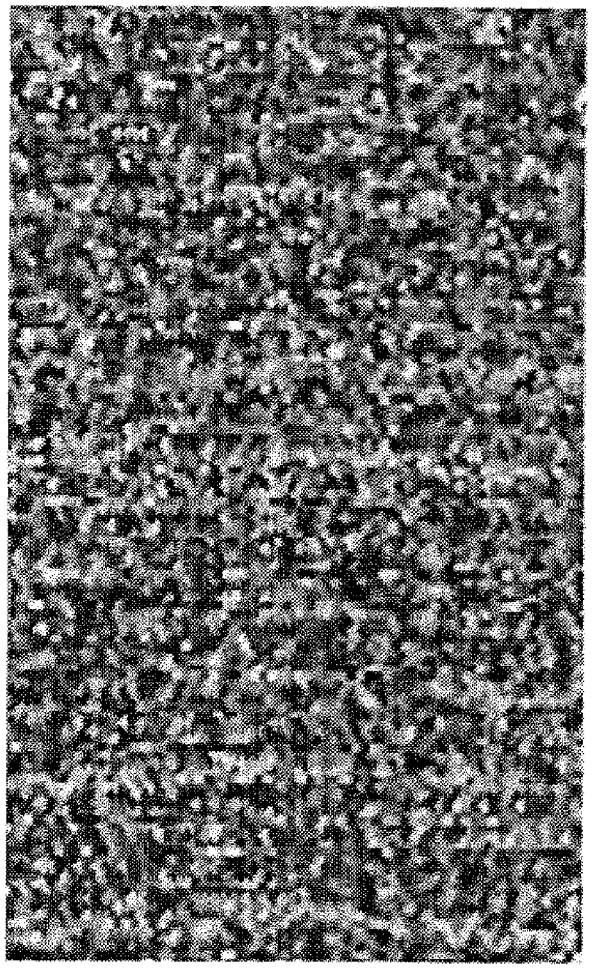
0°　　　　5°
Angle Color Key

F I G. 2 7

| | COMPARATIVE EXAMPLE 2 | EXAMPLE 3 | EXAMPLE 4 | EXAMPLE 5 | EXAMPLE 6 | EXAMPLE 7 |
|---|---|---|---|---|---|---|
| TREATMENT CONDITIONS IN FIRING KEEP STEP | ABSENCE | 880°C×3h. | 880°C×3h. | 880°C×3h. | 880°C×3h. | 880°C×3h. |
| POLARIZATION TEMPERATURE | 25°C | 25°C | 80°C | 80°C | 80°C | 80°C |
| AGING TREATMENT CONDITIONS | ABSENCE | ABSENCE | ABSENCE | 250°C×0.5h. | 250°C×12h. | 250°C×100h. |
| DIFFUSE SCATTERING INTENSITY RATIO | 0.51 | 0.47 | 0.40 | 0.31 | 0.30 | 0.32 |
| DEGREE OF c-AXIS ORIENTATION | 3.1 | 3.1 | 3.1 | 2.1 | 2.0 | 2.4 |
| RATIO OF BANDED STRUCTURE OCCUPYING IN GRAINS [%] | 0 | 5 | 8 | 10 | 12 | 9 |
| WIDTH OF NON-180° DOMAINS [μm] | 0.1~0.4 | 0.1~0.5 1~3 | 0.1~0.8 1~4 | 0.1~0.8 1~5 | 0.1~0.8 1~5 | 0.1~0.8 1~5 |
| RELATIVE DIELECTRIC CONSTANT ε | 1094 | 1170 | 1355 | 1470 | 1500 | 1180 |
| $d_{31}$ [pm/V] | 99 | 104 | 108 | 108 | 108 | 108 |
| tan δ [%] | 1.2 | 1.2 | 1.0 | 0.9 | 0.9 | 1.0 |
| $S_{4000}$ [ppm] | 550 | 602 | 730 | 825 | 865 | 770 |

FIG. 29

| | COMPARATIVE EXAMPLE 3 | EXAMPLE 8 | EXAMPLE 9 | EXAMPLE 10 | EXAMPLE 11 | EXAMPLE 12 |
|---|---|---|---|---|---|---|
| TREATMENT CONDITIONS IN FIRING KEEP STEP | ABSENCE | 850°C×4h. | 850°C×4h. | 850°C×4h. | 850°C×4h. | 850°C×4h. |
| POLARIZATION TEMPERATURE | 25°C | 25°C | 75°C | 75°C | 75°C | 75°C |
| AGING TREATMENT CONDITIONS | ABSENCE | ABSENCE | ABSENCE | 100°C× 12h. | 150°C× 12h. | 300°C× 12h. |
| DIFFUSE SCATTERING INTENSITY RATIO | 0.51 | 0.45 | 0.36 | 0.27 | 0.18 | 0.30 |
| DEGREE OF c-AXIS ORIENTATION | 3.5 | 3.4 | 3.4 | 2.6 | 2.4 | 2.8 |
| RATIO OF BANDED STRUCTURE OCCUPYING IN GRAINS [%] | 0 | 10 | 12 | 18 | 20 | 15 |
| WIDTH OF NON-180° DOMAINS [μm] | 0.1~0.7 | 0.1~0.7 1~4 | 0.1~0.8 1~5 | 0.1~0.8 1~10 | 0.1~0.8 1~10 | 0.1~0.8 1~10 |
| RELATIVE DIELECTRIC CONSTANT ε | 980 | 1125 | 1195 | 1240 | 1285 | 1255 |
| d₃₁ [pm/V] | 98 | 108 | 112 | 112 | 112 | 110 |
| tanδ [%] | 1.2 | 0.9 | 0.9 | 0.8 | 0.7 | 0.4 |
| S4000 [ppm] | 623 | 673 | 750 | 830 | 900 | 770 |

FIG. 30

| | COMPARATIVE EXAMPLE 4 | EXAMPLE 13 | EXAMPLE 14 | EXAMPLE 15 |
|---|---|---|---|---|
| TREATMENT CONDITIONS IN FIRING KEEP STEP | ABSENCE | 860°C×10h. | 860°C×10h. | 860°C×10h. |
| POLARIZATION TEMPERATURE | 25°C | 25°C | 75°C | 75°C |
| AGING TREATMENT CONDITIONS | ABSENCE | ABSENCE | ABSENCE | 250°C× 12h. |
| DIFFUSE SCATTERING INTENSITY RATIO | 0.52 | 0.45 | 0.42 | 0.33 |
| DEGREE OF c-AXIS ORIENTATION | 3.2 | 3.1 | 3.1 | 2.1 |
| RATIO OF BANDED STRUCTURE OCCUPYING IN GRAINS [%] | 0 | 15 | 18 | 25 |
| WIDTH OF NON-180° DOMAINS [$\mu$m] | 0.1~0.4 | 0.1~0.7 1~4 | 0.1~0.8 1~5 | 0.1~0.8 1~10 |
| RELATIVE DIELECTRIC CONSTANT $\epsilon$ | 1234 | 1311 | 1375 | 1533 |
| $d_{31}$ [pm/V] | 106 | 105 | 105 | 108 |
| $\tan\delta$ [%] | 1.3 | 1.3 | 1.3 | 1.2 |
| $S_{4000}$ [ppm] | 610 | 680 | 750 | 860 |

PIEZOELECTRIC/ELECTROSTRICTIVE CERAMICS SINTERED BODY HAVING A BANDED STRUCTURE

BACKGROUND OF THE INVENTION

1. Field of the Invention

The present invention relates to an alkali niobate-based piezoelectric/electrostrictive ceramics sintered body having a large electric-field-induced strain during application of a high electric field and a method of calculating a diffuse scattering intensity ratio, which method can easily obtain a diffuse scattering intensity ratio that serves as an index for improving a electric-field-induced strain of an alkali niobate-based piezoelectric/electrostrictive ceramics sintered body during application of a high electric field.

2. Description of the Background Art

A piezoelectric/electrostrictive actuator has an advantage in that a displacement can be accurately controlled in the order of submicrons. In addition to the accurate control of a displacement, a piezoelectric/electrostrictive actuator using a piezoelectric/electrostrictive ceramics sintered body as a piezoelectric/electrostrictive body, in particular, has advantages of high electric-mechanical conversion efficiency, high generation power, high response speed, high durability and low power consumption. Accordingly, the piezoelectric/electrostrictive actuator using the piezoelectric/electrostrictive ceramics sintered body as the piezoelectric/electrostrictive body is adopted as a head of an inkjet printer, an injector of a diesel engine or the like while making use of these advantages.

Conventionally, a lead titanate zirconate (PZT)-based sintered body is used as the piezoelectric/electrostrictive ceramics sintered body for the piezoelectric/electrostrictive actuator. However, since there is growing concern about the influence that the elution of lead from the sintered body may have on the global environment, an alkali niobate-based sintered body has begun to be considered as the piezoelectric/electrostrictive ceramics sintered body.

Japanese Patent Application Laid-Open No. 2008-78267 is a prior art document describing an invention relating to the present invention. The Japanese Patent Application Laid-Open No. 2008-78267 mentions a domain structure of an alkali niobate-based piezoelectric/electrostrictive ceramics sintered body.

However, a domain structure of the conventional alkali niobate-based piezoelectric/electrostrictive ceramics sintered body, which can improve a electric-field-induced strain during application of a high electric field, is unknown. As a result, a electric-field-induced strain during application of a high electric field cannot be obtained.

SUMMARY OF THE INVENTION

According to a first aspect of the present invention, a piezoelectric/electrostrictive ceramics sintered body includes a perovskite type oxide serving as a main crystal phase, the perovskite type oxide containing at least one type of element selected from the group consisting of Li, Na and K as A site constituent elements, and at least one type of element selected from the group consisting of Nb and Ta as B site constituent elements, wherein a diffuse scattering intensity ratio is equal to or lower than 0.5, the diffuse scattering intensity ratio being a ratio of an intensity of diffuse scattering by a lattice-strained layer present near a domain wall to a sum of an X-ray diffraction intensity of a first lattice plane and an X-ray diffraction intensity of a second lattice plane different in interplanar spacing from the first lattice plane due to crystallographic symmetry reduction.

An alkali niobate-based piezoelectric/electrostrictive ceramics sintered body having a large electric-field-induced strain during application of high electric field is provided.

Preferably, the piezoelectric/electrostrictive ceramics sintered body has a "Banded structure" in which each of the bands forms, together with an adjacent band, a non-180° domain structure.

According to a second aspect of the present invention, a method of calculating a diffuse scattering intensity ratio, the diffuse scattering intensity ratio being a ratio of an intensity of diffuse scattering by a lattice-strained layer present near a domain wall, includes to a sum of an X-ray diffraction intensity of a first lattice plane and an X-ray diffraction intensity of a second lattice plane different in interplanar spacing from the first lattice plane due to crystallographic symmetry reduction: (a) identifying a first peak and a second peak separated from peaks appearing on an X-ray diffraction profile due to crystallographic symmetry reduction as compared with a cubic system; (b) reading full width at half maximum $W_1$ and $W_2$ and heights $I_1$ and $I_2$ of the first peak and the second peak from the X-ray diffraction profile, respectively; (c) calculating areas $S_1 = I_1 \times W_1$ and $S_2 = I_2 \times W_2$ of the first peak and the second peak from the full width at half maximum $W_1$ and $W_2$ and the heights $I_1$ and $I_2$ read in (b), respectively; (d) reading angles $2\theta = 2\theta_1$ and $2\theta_2$ of the first peak and the second peak from the X-ray diffraction profile, respectively; (e) reading a height $I_{DS}$ of the X-ray diffraction profile at an angle $2\theta = (2\theta_1 + 2\theta_2)/2$ that is a center of the angles $2\theta = 2\theta_1$ and $2\theta_2$ read in (d); (f calculating a diffuse scattering area $S_{DS} = I_{DS} \times (2\theta_2 - 2\theta_1)$ from the angles $2\theta = 2\theta_1$ and $2\theta_2$ read in (d) and the height $I_{DS}$ read in (e); and (g) calculating a diffuse scattering intensity ratio $S_{DS}/(S_1 + S_2)$ from the areas $S_1$ and $S_2$ calculated in (c) and the diffuse scattering area $S_{DS}$ calculated in (f).

The present invention can provide a method of calculating the diffuse scattering intensity ratio from which the diffuse scattering intensity ratio that serves as an index for improving a electric-field-induced strain of an alkali niobate-based piezoelectric/electrostrictive ceramics sintered body during application of a high electric field which can be easily obtained.

It is, therefore, a first object of the present invention to provide an alkali niobate-based piezoelectric/electrostrictive ceramics sintered body having a large electric-field-induced strain during application of a high electric field.

It is a second object of the present invention to provide a method of calculating a diffuse scattering intensity ratio from which a diffuse scattering intensity ratio that serves as an index for improving a electric-field-induced strain of an alkali niobate-based piezoelectric/electrostrictive ceramics sintered body during application of a high electric field method which is easily be obtained.

These and other objects, features, aspects and advantages of the present invention will become more apparent from the following detailed description of the present invention when taken in conjunction with the accompanying drawings.

BRIEF DESCRIPTION OF THE DRAWINGS

FIG. 1 is a pattern diagram showing an ideal crystal lattice that does not include a lattice-strained layer.

FIG. 2 is a pattern diagram showing an actual crystal lattice that includes a lattice-strained layer.

FIGS. 4 and 5 are pattern diagrams each showing a desired domain structure of piezoelectric/electrostrictive ceramics according to a first embodiment of the present invention.

FIG. 6 is a flowchart showing a flow of calculation of a degree of c-axis orientation and a diffuse scattering intensity ratio according to a second embodiment of the present invention.

FIG. 10 is a cross-sectional view of a piezoelectric/electrostrictive actuator according to a fourth embodiment of the present invention.

FIG. 11 is a cross-sectional view of a piezoelectric/electrostrictive actuator according to a fifth embodiment of the present invention.

FIG. 12 is a cross-sectional view of a piezoelectric/electrostrictive actuator according to a sixth embodiment of the present invention.

FIG. 13 is a perspective view of a piezoelectric/electrostrictive actuator according to a seventh embodiment of the present invention.

FIG. 17 is a table showing influences of presence or absence of a firing keep step and treatment conditions in the firing keep step.

FIG. 21 is a drawing-substitute photograph showing mapping of fluctuation amounts within a rectangular region shown in FIG. 20 in crystal orientation.

FIG. 27 is a table showing influences of presence or absence of a firing keep step, treatment conditions for polarization, presence or absence of an aging treatment and treatment conditions for the aging treatment.

FIG. 29 is a table showing influences of presence or absence of a firing keep step, treatment conditions for polarization, presence or absence of an aging treatment and treatment conditions for the aging treatment.

FIG. 30 is a table showing influences of presence or absence of the firing keep step, treatment conditions for the polarization and presence or absence of the aging treatment.

DESCRIPTION OF THE PREFERRED EMBODIMENTS

1. First Embodiment

Figure 3:
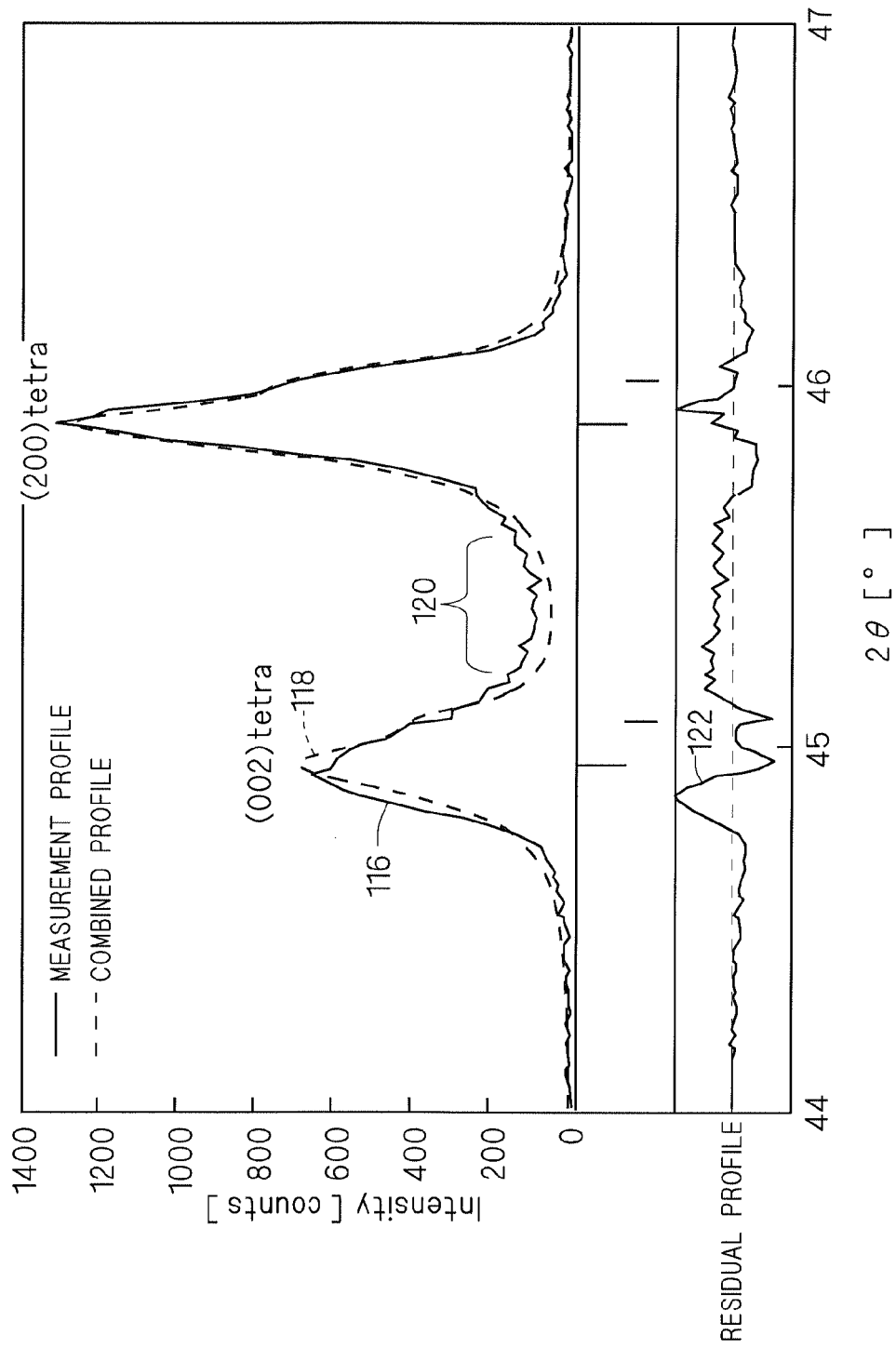
FIG. 3 is a chart showing an example of an X-ray diffraction profile of an (Li, Na, K)(Nb, Ta)O$_3$-based piezoelectric/electrostrictive ceramics sintered body and profile fitting.

A first embodiment of the present invention relates to a piezoelectric/electrostrictive ceramics sintered body.

1.1 Composition

The piezoelectric/electrostrictive ceramics sintered body according to the first embodiment is an (Li, Na, (Nb, Ta) O$_3$-based piezoelectric/electrostrictive ceramics sintered body having, as a main crystal phase, a perovskite type oxide containing at least one type of element selected from the group consisting of Li (lithium), Na (sodium) and K (potassium) as A site constituent elements, and at least one type of element selected from the group consisting of Nb (niobium) and Ta (tantalum) as B site constituent elements.

A composition of main components is represented by a general formula $\{Li_y(Na_{1-x}K_x)_{1-y}\}_a(Nb_{1-z}Ta_z)O_3$ and preferably satisfies $0.9 \leq a \leq 1.1$, $0.2 \leq x \leq 0.8$, $0.0 \leq y \leq 0.1$ and $0.0 \leq z \leq 0.5$. The reason for setting $0.9 \leq a \leq 1.1$ is as follows. If a is below this range, a degree of sintering tends to fall. If a exceeds this range, then a dielectric loss tends to increase and a electric-field-induced strain during application of a high electric field tends to fall. The reason for setting $0.2 \leq x \leq 0.8$, $0.0 \leq y \leq 0.1$ and $0.0 \leq z \leq 0.5$ is that the electric-field-induced strain during application of the high electric field tends to fall if x, y and z are out of these ranges.

Furthermore, Sb (antimony) may be introduced into the B site constituent elements among the main components so as to further improve the electric-field-induced strain during application of the high electric field. In this case, the composition of the main components is represented by a general formula $\{Li_y(Na_{1-x}K_x)_{1-y}\}_a(Nb_{1-z-w}Ta_zSb_w)O_3$ and preferably satisfies $0.9 \leq a \leq 1.1$, $0.2 \leq x \leq 0.8$, $0.0 \leq y \leq 0.1$, $0.0 \leq z \leq 0.5$ and $0 < w \leq 0.1$. The reason for setting $w \leq 0.1$ is that the electric-field-induced strain during application of the high electric field tends to fall if w exceeds this range. An effect of introduction of Sb appears generally when $0.01 \leq w$.

To further improve the electric-field-induced strain during the application of the high electric field, Bi (bismuth) may be introduced into the A site constituent elements among the main components. In this case, the composition of the main components is represented by a general formula $[\{Li_y(Na_{1-x}K_x)_{1-y}\}_{1-t}Bi_t]_a(Nb_{1-z}Ta_z)O_3$ and preferably satisfies $0.9 \leq a \leq 1.1$, $0.2 \leq x \leq 0.8$, $0.0 \leq y \leq 0.1$, $0.0 \leq z \leq 0.5$ and $0.0 < t \leq 0.1$. The reason for setting $t \leq 0.1$ is that the electric-field-induced strain during application of the high electric field tends to fall if t exceeds this range. An effect of introduction of Bi appears generally when $0.0001 \leq t$.

To further improve the electric-field-induced strain during the application of the high electric field, Sb may be introduced into the B site constituent elements among the main components and Bi$_2$O$_3$ (bismuth oxide) may be introduced as an accessory component. In this case, the composition of the main components is represented by a general formula $\{Li_y(Na_{1-x}K_x)_{1-y}\}_a(Nb_{1-z-w}Ta_zSb_w)O_3$ and preferably satisfies $0.9 \leq a \leq 1.1$, $0.2 \leq x \leq 0.8$, $0.0 \leq y \leq 0.1$, $0.0 \leq z \leq 0.5$ and $0 < w \leq 0.1$. The reason for setting $w \leq 0.1$ is that the electric-field-induced strain during application of the high electric field tends to fall if w exceeds this range. The effect of introduction of Sb appears generally when $0.01 \leq w$. It is also preferable that a content of the accessory component $Bi_2O_3$ with respect to 100 molar parts of the main components is equal to or lower than 0.05 molar parts. This is because the electric-field-induced strain during the application of the high electric field tends to fall if the content of $Bi_2O_3$ exceeds this range. An effect of introduction of $Bi_2O_3$ appears generally when $0.0001 \leq t$.

Moreover, it is preferable to further contain at least one type of metallic element selected from the group consisting of Ag (silver), Mn (manganese), Cr (chromium), Fe (iron), Co (cobalt), Ni (nickel), Cu (copper) and Zn (zinc). A content of these metallic elements with respect to 100 molar parts of the main components is preferably equal to or lower than 3 molar parts. This is because the dielectric loss tends to increase and the electric-field-induced strain during the application of the high electric field tends to fall if the content of these metallic elements exceeds this range. An effect is caused by the addition of these metallic elements generally when the content is equal to or higher than 0.01 molar parts. These metallic elements are transition metal elements or typical metal elements and belong to Groups 6 to 12 in the fourth period which groups are similar in chemical properties. These metallic elements may be present in a grain boundary as oxides or the like, contained in grains of the main crystal phase or contained in a hetero-phase.

1.2 Degree of C-Axis Orientation

It is preferable that a degree of c-axis orientation of the piezoelectric/electrostrictive ceramics sintered body according to the first embodiment is equal to or lower than 3. This is because non-180° domains tend to decrease and the electric-field-induced strain during the application of a high electric field tends to fall if the degree of c-axis orientation is higher than 3. It is ideally preferable that the degree of c-axis orientation is 0. The "degree of c-axis orientation" herein means a degree of c-axis orientation on a surface perpendicular to a polarization direction.

It is also preferable that the degree of c-axis orientation of the piezoelectric/electrostrictive ceramics sintered body according to the first embodiment is equal to or lower than 3 by making the piezoelectric/electrostrictive ceramics sintered body contain many of the non-180° domains.

1.3 Lattice-Strained Layer and Diffuse Scattering Intensity

FIGS. 1 and 2 are pattern diagrams illustrating a lattice-strained layer of the piezoelectric/electrostrictive ceramics sintered body. FIG. 1 is a pattern diagram showing an ideal crystal lattice that does not include a lattice-strained layer and a domain wall if a crystal system of the crystal lattice is a tetragonal system. FIG. 2 is a pattern diagram showing an actual crystal lattice that includes a lattice-strained layer and an actual domain wall if the crystal system of the crystal lattice is a tetragonal system.

As shown in FIG. 1, in the ideal crystal lattice, a first domain 102 and a second domain 104 are clearly separated across a domain wall 106 that is a (101) plane as a boundary. That is, the ideal crystal lattice does not include a boundary layer near the domain wall 106. On the other hand, as shown in FIG. 2, in the actual crystal lattice, a first domain 108 and a second domain 110 are not clearly separated across a domain wall 114 that is the (101) plane as a boundary. That is, the actual crystal lattice includes a boundary layer 112 having deteriorated periodicity of the crystal lattice near the domain wall 114. Generally, the boundary layer 112 having such a thickness is referred to as a "lattice-strained layer" and X-ray scattering resulting from the lattice-strained layer 112 is referred to as "diffuse scattering."

FIG. 3 is a chart showing an example of an X-ray diffraction profile of a (Li, Na, K)(Nb, Ta)O$_3$-based piezoelectric/electrostrictive ceramics sintered body. FIG. 3 shows an X-ray diffraction profile at angle 2θ=44° to 47° at which a peak appears on a (002) plane in the tetragonal system (denoted by "(002)$_{tetra}$" in FIG. 3) and a peak appears on a (200) plane in the tetragonal system (denoted by "(200)$_{tetra}$" in FIG. 3).

As shown in FIG. 3, a combined profile 118 obtained by combining a profile fitting to the peak of the (002) plane of a measured profile 116 with a profile fitting to the peak of the (200) plane of the measured profile 116 is obtained. If the measured profile 116 is compared with the combined profile 118, a profile (hereinafter, referred to as a "bridge profile") 120 that cannot be explained by the combined profile 118 is present in a 2θ angle range between the peak of the (002) plane and the peak of the (200) plane. Profiles similar to such a bridge profile 120 are also present between a peak of a (001) plane and a peak of a (100) plane, between a peak of a (004) plane and a peak of a (400) plane and the like. More generally, a bridge profile is present between a peak of a first lattice plane and a peak of a second lattice plane different in an interplanar spacing from the first lattice plane due to crystallographic symmetry reduction.

The bridge profile 120 is a diffuse scattering profile from the lattice-strained layer 112. However, the lattice-strained layer 112 continuously connects the first domain 108 to the second domain 110 by making the crystal system of the lattice-strained layer 112 gradually closer to a cubic system toward the domain wall 114. Due to this, the bridge profile 120 does not form a clear peak.

Actually, as shown in FIG. 3, a residual profile 122 obtained by subtracting the combined profile 118 from the measured profile 116 is a horn profile higher near the peaks of the (002) plane and the (200) plane of the measured profile 116 and keeping a plateau between the peak of the (002) plane and the peak of the (200) plane.

It is said that the lattice-strained layer 112 occupies about 30% of an entire volume in a PZT-based piezoelectric/electrostrictive ceramics sintered body (J. E. Daniels et al., J. Phys. D: Appl. Phys. 39 (2006) 5294). It is also said that a diffuse scattering intensity becomes higher as a density of the domain wall 114 accompanying the lattice-strained layer 112 is higher and the lattice-strained layer 112 is thicker (A. I. Ustinov et al., Materials Science Forum 321-324 (2000) 109).

In the piezoelectric/electrostrictive ceramics sintered body according to the first embodiment, it is preferable that the number of lattice-strained layers 112 is smaller. In addition, it is preferable that a diffuse scattering intensity ratio that is a ratio of an intensity of diffuse scattering by the lattice-strained layers to a sum of an X-ray diffraction intensity of the first lattice plane and an X-ray diffraction intensity of the second lattice plane different in interplanar spacing from the first lattice plane, due to crystallographic symmetry reduction, that is, due to the reduction of symmetry from that of the cubic system that is equal to or lower than 0.5. This is because the electric-field-induced strain during application of the high electric field can be improved if the diffuse scattering intensity ratio is equal to or lower than 0.5 and the number of lattice-strained layers 112 is smaller. It is assumed that the "first lattice plane" mentioned herein includes all lattice planes equal in interplanar spacing and having degenerate peaks on an X-ray diffraction profile, for example, both the (100) plane and a (010) plane if the crystal system is a tetragonal system.

1.4 Domain Structure

FIGS. 4 and 5 are pattern diagrams showing a desired domain structure of the piezoelectric/electrostrictive ceramics sintered body according to the first embodiment. FIGS. 4 and 5 are cross-sectional views showing the domain structure in a cross section of the piezoelectric/electrostrictive ceramics sintered body.

As shown in FIGS. 4 and 5, the piezoelectric/electrostrictive ceramics sintered body according to the first embodiment includes a domain structure called a "Banded structure" or a "Band structure" in which bands 116 forms a non-180° domain structure by adjacent bands 116, that is, different from adjacent bands 116 in crystal orientation by about 90° are arranged. This can improve characteristics, which are typified by the electric-field-induced strain during the application of the high electric field, of the piezoelectric/electrostrictive ceramics sintered body. "About 90°" herein means that a difference between the adjacent bands 116 in crystal orientation is not precisely 90° but varies to an extent from −2° to 2° due to a difference between lengths of a c-axis and an a-axis of the crystal lattice even if the crystal system is the tetragonal system or due to the fluctuation of the crystal orientation among interiors of the bands 116 that constitute the Banded structure.

Examples of the Banded structure mainly include a Herring bone structure in a lattice fringe-shape in which the bands 116 are arranged in one direction as shown in FIG. 4 and a Square net structure in a network shape in which the bands 116 are arranged in two directions as shown in FIG. 5. The Banded structure included in the piezoelectric/electrostrictive ceramics sintered body according to the first embodiment may be either the Herring bone type or the Square net type, or a mixture of the Herring bone type and the Square net type.

Preferably, a ratio of the Banded structure occupying in grains is 4% to 80% in terms of an area ratio in a cross section. It is also preferable that a width of an arrangement direction of the bands 116 that constitute the Banded structure (a band arrangement direction width) is 1 to 10 μm. It is further preferable that the crystal orientation in a domain within the bands 116 that constitute the Banded structure fluctuates from −2° to 2° in a cycle of 0.05 to 0.5 μm. It is thereby possible to improve the characteristics of the piezoelectric/electrostrictive ceramics sintered body typified by the electric-field-induced strain during the application of the high electric field.

1.5 Reduction of Diffuse Scattering Intensity Ratio by Compounding

To reduce the diffuse scattering intensity ratio, the piezoelectric/electrostrictive ceramics sintered body may be a ceramics composite (ceramics compound) having a microstructure in which a mother phase and an additive material phase different in composition coexist and in which the additive material phase is dispersed in the mother phase. It is confirmed that the piezoelectric/electrostrictive ceramics sintered body is the ceramics composite by analyzing an element distribution of a polished surface of the piezoelectric/electrostrictive ceramics sintered body by EPMA (Electron Probe Micro Analysis) or the like.

The "mother phase" herein means an alkali niobate-based perovskite type oxide containing at least one type of element selected from the group consisting of Li, Na and K as A site constituent elements, and at least one type of element selected from the group consisting of Nb and Ta as B site constituent elements. The "additive material phase" may be an oxide that shows piezoelectric/electrostrictive characteristics different in composition or a composition ratio from the perovskite type oxide or an oxide other than the above oxide.

If the additive material phase is an oxide that shows piezoelectric/electrostrictive characteristics, the composition of the mother phase and that of the additive material phase are selected so that a residual strain of the simple additive material phase is higher than that of the simple mother phase. By doing so, if polarization is conducted on the piezoelectric/electrostrictive ceramics sintered body (ceramics compound), the additive material phase is strained more largely than the mother phase. Due to this, within the mother phase, a compressive stress is produced in a direction parallel to a polarization electric field and a tensile stress is produced in a direction perpendicular to the polarization electric field. The compressive stress and the tensile stress increase reversibility of the non-180° domain of the mother phase. If the reversibility of the non-180° domain of the mother phase increases, then a reversible strain becomes higher as the residual strain of the mother phase is lower, the diffuse scattering intensity ratio falls and the electric-field-induced strain of the piezoelectric/electrostrictive ceramics sintered body during the application of the high electric field increases.

Each of the residual strain of the "simple" additive material phase and that of the "simple" mother phase is specified by producing a piezoelectric/electrostrictive ceramics sintered body identical in composition to the additive material phase and the mother phase respectively, and measuring each of the residual strain of the additive material phase and the mother phase. Whether the residual strain is high or low is determined by residual strain when the polarization is conducted under the same polarization conditions.

To set the residual strain of the simple additive material phase higher than that of the simple mother phase, the mother phase differs in composition from the additive material phase. To set the residual strain of the additive material phase higher than that of the mother phase, it is preferable to make z in the general formula, which symbol indicates a Ta amount, of the additive material phase smaller than that of the mother phase, make y in the general formula, which symbol indicates a Li amount, of the additive material phase smaller than that of the mother phase and make an A/B ratio of the additive material phase higher than that of the mother phase.

When constituent elements of the mother phase are compared with those of the additive material phase, the number of elements that are not common is preferably zero. If the number of elements that are not common is zero, mutual diffusion between the mother phase and the additive material phase during firing can be suppressed. Nonetheless, as long as the difference between the residual strain of the mother phase and that of the additive material phase is sufficiently large, a similar effect can be obtained even if the number of elements that are not common is one.

While the mother phase is a solid solution having the composition stated above, the mother phase may contain a slight amount of grain boundary segregated matters. Likewise, while the additive material phase is a solid solution having the composition stated above, the additive material phase may contain a slight amount of grain boundary segregated matters.

If the additive material phase is an oxide that does not show piezoelectric/electrostrictive characteristics, the composition of the mother phase and that of the additive material phase are selected so that a thermal expansion coefficient of the simple additive material phase is lower than that of the simple mother phase. By doing so, in a temperature cooling process after firing the piezoelectric/electrostrictive ceramics sintered body (ceramics compound), a thermal stress resulting from a thermal expansion difference is introduced into the sintered body. That is, a compressive stress is introduced into grains constituting the mother phase that is the alkali niobate-based perovskite type oxide and a tensile stress is introduced into the grain boundary. The compressive stress and the tensile stress increase the reversibility of the non-180° domain of the mother phase. If the reversibility of the non-180° domain of the mother phase increases, then the reversible strain becomes higher as the residual strain of the mother phase is lower, the diffuse scattering intensity ratio falls and the electric-field-induced strain of the piezoelectric/electrostrictive ceramics sintered body during the application of the high electric field increases.

Each of the thermal expansion coefficient of the "simple" additive material phase and that of the "simple" mother phase is specified by producing a piezoelectric/electrostrictive ceramics sintered body identical in composition to the additive material phase and the mother phase respectively and measuring each of the thermal expansion coefficients of the additive material phase and the mother phase.

Examples of materials lower in thermal expansion coefficient than the alkali niobate-based perovskite type oxide include molybdenum oxide, niobium oxide, tin oxide, tungsten oxide and aluminum oxide.

2. Second Embodiment

A second embodiment of the present invention relates to a method of calculating a degree of c-axis orientation and a diffuse scattering intensity ratio.

Figure 7:
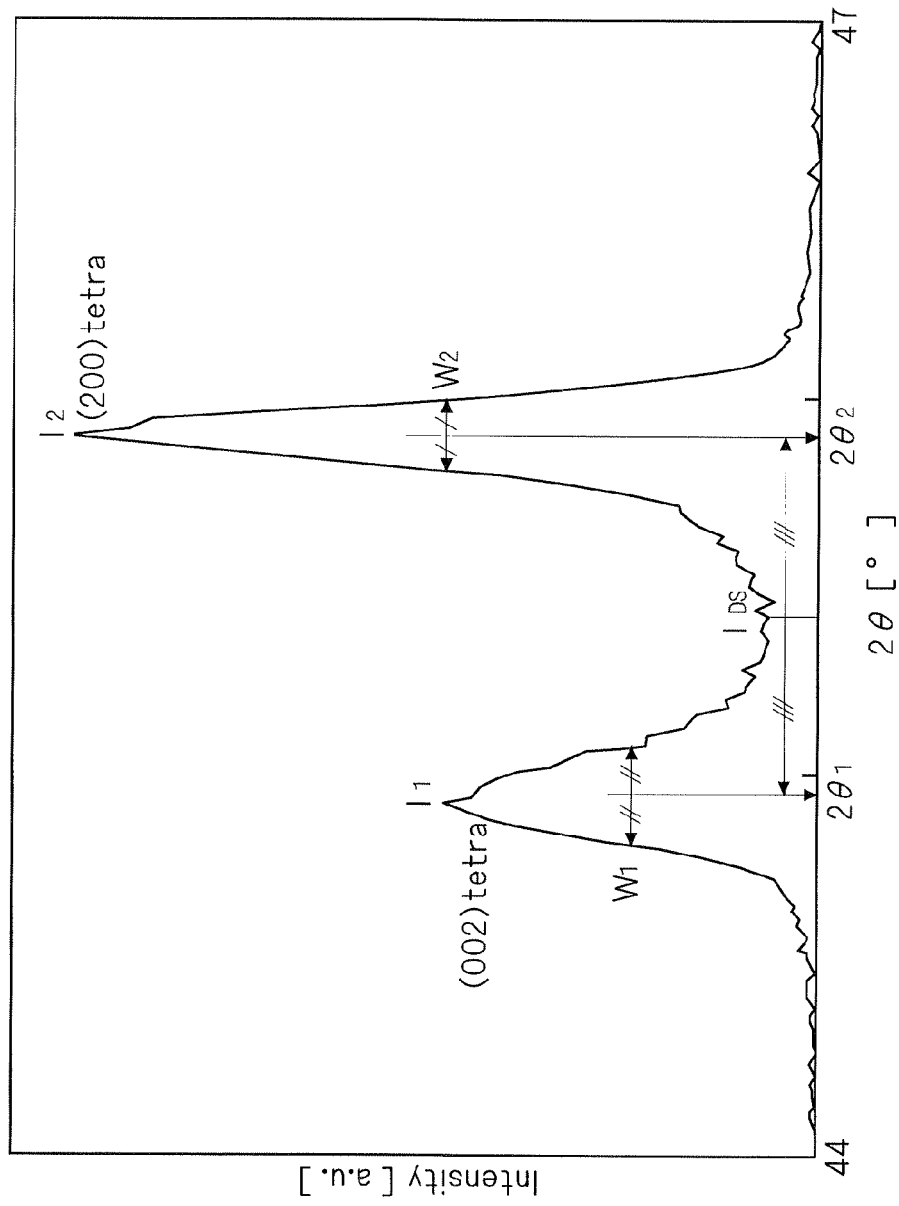
FIG. 7 is a chart showing an example of an X-ray diffraction profile according to the second embodiment.

2.1 Method of Calculating Degree of C-Axis Orientation and Diffuse Scattering Intensity Ratio FIGS. 6 and 7 are diagrams illustrating the method of calculating the degree of c-axis orientation and the diffuse scattering intensity ratio according to the second embodiment. FIG. 6 is a flowchart showing a flow of calculation of the degree of c-axis orientation and the diffuse scattering intensity ratio according to the second embodiment. FIG. 7 is a chart showing an example of an X-ray diffraction profile according to the second embodiment. FIG. 7 shows an X-ray diffraction profile at angle $2\theta=44°$ to $47°$ at which a peak appears on a (002) plane in the tetragonal system (denoted by "$(002)_{tetra}$" in FIG. 7) and a peak appears on a (200) plane in the tetragonal system (denoted by "$(200)_{tetra}$" in FIG. 7).

(a) Measure X-Ray Diffraction Profile (Step S201)

To calculate the degree of c-axis orientation and the diffuse scattering intensity ratio, first, an X-ray diffraction profile is measured by performing $2\theta/\theta$ scan. The X-ray diffraction profile is measured using an X-ray powder diffractometer including an X-ray source, a diffractive optical system, a monochromater and a detector. X-rays used in measurement is CuKα rays.

For example, a Bragg-Brentano type focusing geometry or a Guinier reflection geometry is used as the diffractive optical system.

If the Bragg-Brentano type focusing geometry is used, it is preferable to set a counter monochromater using curved graphite between a sample and the detector. This is intended to improve a resolution of the optical system by eliminating unnecessary X-rays (continuous X-rays, fluorescent X-rays, Kβ rays and the like) other than the CuKα rays.

If the Guinier reflection geometry is used, it is preferable to set an incident monochromater using curved Ge (111) single crystal between the X-ray source and the sample. This is intended to improve the resolution of the optical system by eliminating CuKα-2 rays out of CuKα-1 rays and the CuKα-2 rays that constitute the CuKα rays.

Whether the Bragg-Brentano type focusing geometry or Guinier reflection geometry is used, it is possible to set, for example, a radius of a goniometer to 185 mm, a divergence slit to 1°, a scatter slit to 1° and a receiving slit to 0.3 mm.

However, a configuration of the X-ray diffractometer described above is only an example and the X-ray diffractometer may adopt another configuration as long as the diffractometer can measure an X-ray diffraction profile with sufficiently high resolution and sufficiently high accuracy.

(b) Preprocessing (Step S202)

Next, a necessary preprocessing is performed (step S202). That is, if the Bragg-Brentano type focusing geometry is used, a background and a diffraction peak by CuKα2-rays are eliminated by calculation processing. If the Guinier reflection geometry is used, it suffices to eliminate the background by the calculation processing since the incident monochromater already eliminates the CuKα2-rays.

(c) Identify First and Second Peaks (Step S203)

A first peak and a second peak separated due to crystallographic symmetry reduction are identified from peaks appearing on the X-ray diffraction profile. FIG. 7 shows an instance of selecting a peak on the (002) plane when the crystal system is the tetragonal system as the first peak and a peak on the (200) plane when the crystal system is the tetragonal system as the second peak. Alternatively, other peaks may be selected. For example, a peak on the (001) plane when the crystal system is the tetragonal system and a peak on the (100) plane when the crystal system is the tetragonal system may be selected as the first peak and the second peak, respectively. In another alternative, a peak on the (004) plane when the crystal system is the tetragonal system and a peak on the (400) plane when the crystal system is the tetragonal system may be selected as the first peak and the second peak, respectively.

(d) Read the Full Width at Half Maximum $W_1$ and $W_2$ and the Heights $I_1$ and $I_2$ of First Peak and Second Peak, Respectively (Step S204)

The full width at half maximum $W_1$ and $W_2$ and the heights $I_1$ and $I_2$ of the first peak and the second peak are read from the X-ray diffraction profile, respectively.

(e) Calculate Areas $S_1$ and $S_2$ of First Peak and Second Peak, Respectively (Step S205)

Then, the areas $S_1=I_1 \times W_1$ and $S_2=I_2 \times W_2$ are calculated from the full width at half maximum $W_1$ and $W_2$ and the heights $I_1$ and $I_2$ read in the step S204, respectively. The areas $S_1$ and $S_2$ represent X-ray diffraction intensities on the (002) plane and the (200) plane, respectively.

(f) Read the Angles $2\theta=2\theta_1$ and $2\theta_2$ of First Peak and Second Peak (Step S206)

The angles $2\theta=2\theta_1$ and $2\theta_2$ of the first peak and the second peak are read from the X-ray diffraction profile in addition to the calculation of the areas $S_1$ and $S_2$, respectively. It is preferable that the angles $2\theta=2\theta_1$ and $2\theta_2$ are middle points of full widths at half maximum of the first and second peaks, respectively.

(g) Read Height $I_{DS}$ of X-Ray Diffraction Profile at Angle $2\theta=(2\theta_1+2\theta_2)/2$ (Step S207)

Then, the read is a height $I_{DS}$ of the X-ray diffraction profile at an angle $2\theta=(2\theta_1+2\theta_2)/2$ that is a center of the angles $2\theta=2\theta_1$ and $2\theta_2$ read in the step S206.

(h) Calculate Diffuse Scattering Area $S_{DS}=I_{DS} \times (2\theta_2-2\theta_1)$ (Step S208)

A diffuse scattering area $S_{DS}=I_{DS} \times (2\theta_2-2\theta_1)$ is calculated from the angles $2\theta=2\theta_1$ and $2\theta_2$ read in the step S206 and the height $I_{DS}$ read in the step S207. The diffuse scattering area $S_{DS}$ represents an intensity of diffuse scattering caused by the lattice-strained layers.

(i) Calculate Diffuse Scattering Intensity Ratio $S_{DS}/(S_1+S_2)$ (Step S209)

A diffuse scattering intensity ratio $S_{DS}/(S_1+S_2)$ is calculated from the areas $S_1$ and $S_2$ calculated in the step S205 and the diffuse scattering area $S_{DS}$ calculated in the step S208.

(j) Calculate Degree of C-Axis Orientation (Step S210)

Finally, a degree of c-axis orientation $(S_1/S_2)/(1/2)$ is calculated from the areas $S_1$ and $S_2$ calculated in the step S205. A denominator of the formula for calculating the degree of c-axis orientation "1/2" is a value for making a correction so that the degree of c-axis orientation is "1" in a non-orientation state in which $S_1:S_2=1:2$.

2.2 Advantages of Calculation Method According to the Second Embodiment

In this way, it is possible to calculate the diffuse scattering intensity ratio while suppressing influence of crystallinity and tetragonality by calculating the diffuse scattering intensity ratio not from a ratio $I_{DS}/(I_1+I_2)$ of the height $I_{DS}$ to a sum $(I_1+I_2)$ of the heights $I_1$ and $I_2$ from the ratio $S_{DS}/(S_1+S_2)$ of the diffuse scattering area $S_{DS}$ to a sum $(S_1+S_2)$ of the areas $S_1$ and $S_2$.

That is, if the diffuse scattering intensity ratio is calculated from the ratio $I_{DS}/(I_1+I_2)$, an overlap between a tail of the peak on the (002) plane and a tail of the peak on the (200) plane becomes greater as the crystallinity is lower or the tetragonalness is lower. This results in the larger height $I_{DS}$ and the higher diffuse scattering intensity ratio.

On the other hand, if the diffuse scattering intensity ratio is calculated from the ratio $S_{DS}/(S_1+S_2)$, the influence of magnitude of the overlap between the tail of the peak on the (002) plane and the tail of the peak on the (200) plane is small. Therefore, the crystallinity and the tetragonalness have small influence on the diffuse scattering intensity ratio.

To accurately calculate the areas $S_1$ and $S_2$ and the diffuse scattering area SDS, it is necessary to conduct profile fitting as described in "1.3 Diffuse Scattering Intensity" according to the first embodiment. However, it is not easy for a sophisticated analyst to conduct the profile fitting to a profile such as the bridge profile without having a clear peak. On the other hand, the method of calculating the diffuse scattering intensity ratio according to the second embodiment, though being easy, makes it possible to calculate the diffuse scattering intensity ratio with accuracy enough to serve as an index for improving the electric-field-induced strain of the alkali niobate-based piezoelectric/electrostrictive ceramics sintered body during the application of the high electric field.

3. Third Embodiment

A third embodiment relates to a method of manufacturing a piezoelectric/electrostrictive ceramics sintered body suited for manufacturing the piezoelectric/electrostrictive ceramics sintered body according to the first embodiment.

Figure 8:
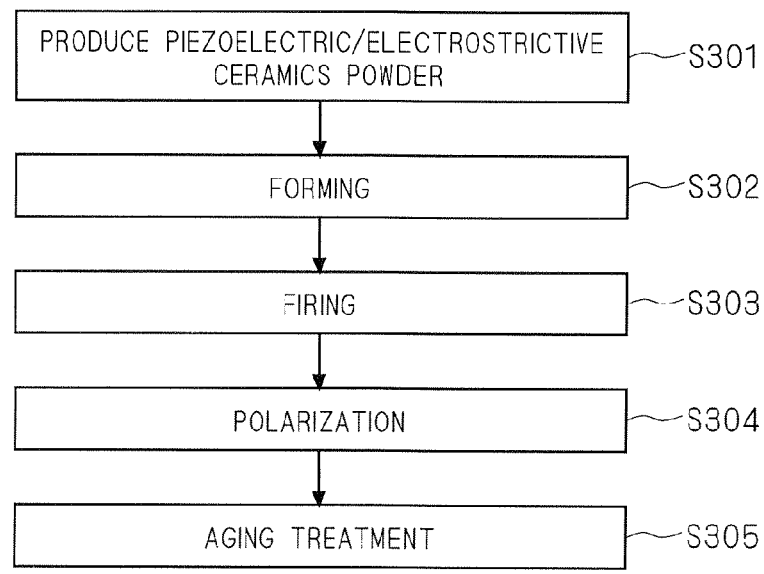
FIG. 8 is a flowchart showing a flow of manufacture of a piezoelectric/electrostrictive ceramics sintered body according to a third embodiment of the present invention.

FIG. 8 is a flowchart showing a flow of manufacture of the piezoelectric/electrostrictive ceramics sintered body according to the third embodiment.

(a) Produce a Piezoelectric/Electrostrictive Ceramics Powder (Step S301)

For manufacturing the piezoelectric/electrostrictive ceramics sintered body, a piezoelectric/electrostrictive ceramics powder having the composition described in "Composition" according to the first embodiment is first produced (step S301). At this time, the piezoelectric/electrostrictive ceramics powder having a slightly adjusted composition may be produced in view of volatilization, diffusion and the like during firing.

(b) Forming (Step S302)

Next, the piezoelectric/electrostrictive ceramics powder produced in the step S301 is formed into a compact. Forming is performed by extrusion forming, injection forming, pressure forming, casting, tape forming, cold isostatic press (CIP) forming or the like.

(c) Firing (Step S303)

Figure 9:
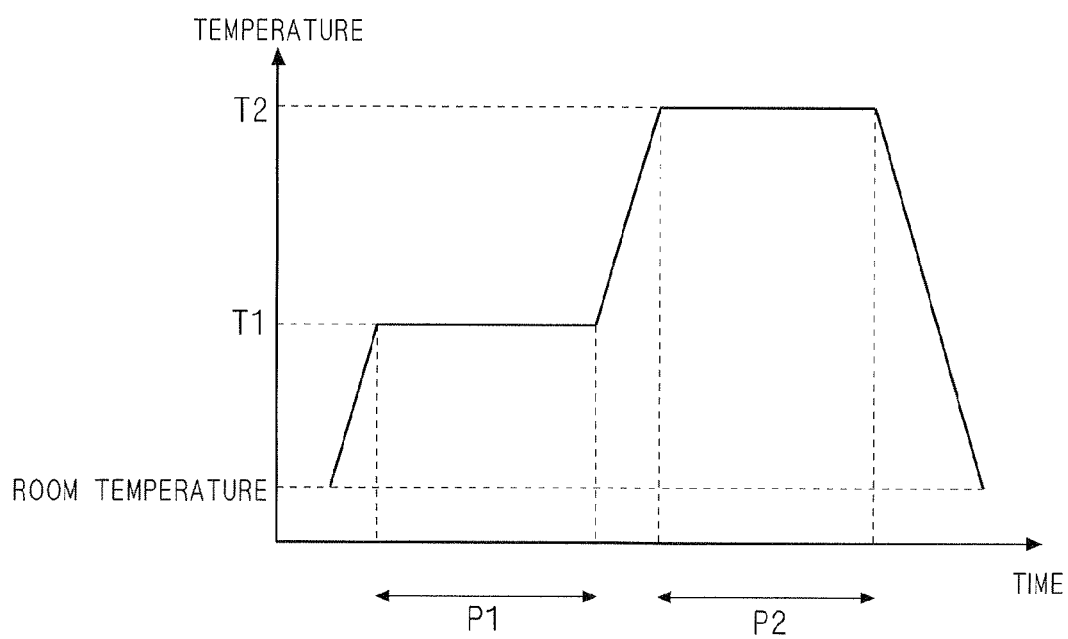
FIG. 9 is a chart showing a firing profile according to the third embodiment.

The compact produced in the step S302 is fired to produce a sintered body. Preferably, the compact is fired using a firing profile shown in FIG. 9. That is, the firing is preferably performed using the firing profile in which temperature is raised to a first temperature T1 and the first temperature T1 is kept for a while (a step of keeping the first temperature T1 is referred to as a "firing keep step," hereinafter), the temperature is raised to the second temperature T2 and the second temperature T2 is kept for a while, and finally, the temperature is dropped to room temperature. Preferably, the first temperature T1 is 800 to 900° C. and the second temperature T2 is 950 to 1100° C. It is also preferable that time P1 for keeping the first temperature T1 is 0.5 to 20 hours and that time P2 for keeping the second temperature T2 is 0.5 to 6 hours. By executing the firing keep step, a bimodal structure having two or more peaks in a distribution of grain diameters can be introduced into the piezoelectric/electrostrictive ceramics sintered body. In consequence, the piezoelectric/electrostrictive ceramics sintered body wherein the diffuse scattering intensity ratio is equal to or lower than 0.5, the ratio of the Banded structure occupying in grains is 4 to 80%, the width of the bands constituting the Banded structure is 1 to 10 μm, and the crystal orientation fluctuates from −2° to 2° in a cycle of 0.05 to 0.5 μm in a domain within the bands that constitute the Banded structure can be obtained.

(d) Polarization (Step S304)

The sintered body produced in the step S303 is subjected to polarization. The polarization is performed by immersing the piezoelectric/electrostrictive ceramics sintered body, having an electrode for polarization formed therein, in insulating oil such as silicone oil and applying voltage to the electrode for polarization. At this time, the high temperature polarization of heating the piezoelectric/electrostrictive ceramics sintered body to 50 to 150° C. is preferably executed. It is preferable to apply an electric field of 2 to 10 kV/mm to the piezoelectric/electrostrictive ceramics sintered body when executing the high temperature polarization. By executing the high temperature polarization, in addition to the firing keep step, it is possible to further reduce the diffuse scattering intensity ratio and further increase the ratio of the Banded structure occupying in grains.

(e) Aging Treatment (Step S305)

The piezoelectric/electrostrictive ceramics sintered body that has been polarized in the step S304 is subjected to an aging treatment. At this time, it is preferable to execute a high temperature aging treatment by heating the piezoelectric/electrostrictive ceramics sintered body to 100 to 300° C. in the air in a state that the electrode for polarization is opened. By executing the high temperature aging treatment in addition to the firing keep step and the high temperature polarization, it is possible to further reduce the diffuse scattering intensity ratio, further increase the ratio of the Banded structure occupying in grains and reduce the degree of c-axis orientation to 3 or lower.

It is considered that reduction of the degree of c-axis orientation by the high temperature aging treatment is caused not by depolarization but mainly by increase of the non-180° domains. The reason is as follows. If the high temperature aging treatment is performed, not only is the electric-field-induced strain during the application of the high electric field increased, but also a relative dielectric constant, a piezoelectric constant and the like improved. Based on this fact, the former, that is, depolarization can be negated.

(f) Compounding Piezoelectric/Electrostrictive Ceramics Sintered Body (if Additive Material Phase is Oxide Showing Piezoelectric/Electrostrictive Characteristics)

If the piezoelectric/electrostrictive ceramics sintered body is formed into a compound, a mixture material of piezoelectric/electrostrictive ceramics powder of the mother phase and piezoelectric/electrostrictive ceramics powder of the additive material phase is prepared when producing the piezoelectric/electrostrictive ceramics powder in the step S301.

The piezoelectric/electrostrictive ceramics powder of the mother phase is produced by mixing and calcinating raw materials of the constituent elements of the mother phase.

When the piezoelectric/electrostrictive ceramics powder of the additive material phase is to be produced, raw materials of the constituent elements of the additive material phase are mixed and calcinated and the obtained calcinated materials are then formed and fired. Next, the obtained sintered body is ground and classified. Reactivity of the piezoelectric/electrostrictive ceramics powder of the additive material phase produced in this way is low. Therefore, even if firing is performed in an environment in which the mother phase and the additive material phase coexist, reaction hardly occurs between the mother phase and the additive material phase. This contributes to suppressing the mutual diffusion of the mother phase and the additive material phase.

(g) Compounding Piezoelectric/Electrostrictive Ceramics Sintered Body (when Additive Material Phase is Oxide Lower in Thermal Expansion Coefficient than Mother Phase)

The piezoelectric/electrostrictive ceramics sintered body is produced by similar steps except that the additive material phase is an oxide other than the alkali niobate-based oxide.

4. Fourth Embodiment

A fourth embodiment of the present invention relates to a piezoelectric/electrostrictive actuator 402 using the piezoelectric/electrostrictive ceramics sintered body according to the first embodiment.

4.1 Overall Structure

FIG. 10 is a pattern diagram of the piezoelectric/electrostrictive actuator 402 according to the fourth embodiment. FIG. 10 is a cross-sectional view of the single-layer piezoelectric/electrostrictive actuator 402.

As shown in FIG. 10, the piezoelectric/electrostrictive actuator 402 has a structure in which an electrode film 408, a piezoelectric/electrostrictive film 410 and an electrode film 412 are stacked on an upper surface of a substrate 404 in this order. The electrode films 408 and 412 present on both principal surfaces of the piezoelectric/electrostrictive film 410, respectively, and are opposed to each other across the piezoelectric/electrostrictive film 410. A layered body 406 in which the electrode film 408, the piezoelectric/electrostrictive film 410 and the electrode film 412 are stacked is fixedly attached to the substrate 404.

To "fixedly attach" herein means to bond the layered body 406 to the substrate 404 by a solid phase reaction on an interface between the substrate 404 and the layered body 406 without using an organic adhesive or an inorganic adhesive.

If voltage is applied to the piezoelectric/electrostrictive actuator 402, the piezoelectric/electrostrictive film 410 expands or contracts in a direction perpendicular to an electric field according to the applied voltage and bending displacement occurs to the piezoelectric/electrostrictive film 410 in the piezoelectric/electrostrictive actuator 402.

4.2 Piezoelectric/Electrostrictive Film 410

The piezoelectric/electrostrictive film 410 is constituted using the piezoelectric/electrostrictive ceramics sintered body according to the first embodiment.

A thickness of the piezoelectric/electrostrictive film 410 is preferably 0.5 to 50 µm, more preferably 0.8 to 40 µm, most preferably 1 to 30 µm. This is because densification tends to be insufficient if the thickness of the piezoelectric/electrostrictive film 410 is below this range. In addition, if the thickness of the piezoelectric/electrostrictive film 410 exceeds this range, a compressive stress during sintering increases. Due to this, it is necessary to make the substrate 404 thick and it is difficult to make the piezoelectric/electrostrictive actuator 402 small in size.

4.3 Electrode Films 408 and 412

A material of the electrode films 408 and 412 is a metal such as platinum, palladium, rhodium, gold or silver or an alloy thereof. It is particularly preferable to use platinum or an alloy containing platinum as a major component because of high heat resistance during firing. Alternatively, a silver-palladium alloy or the like can be suitably used as the material of the electrode films 408 and 412 depending on a firing temperature.

A thickness of each of the electrode films 408 and 412 is preferably equal to or smaller than 15 µm, more preferably equal to or smaller than 5 µm. This is because the electrode films 408 and 412 function as buffer layers and the bending displacement tends to be small if the thickness exceeds this range. It is also preferable that the thickness is equal to or larger than 0.05 µm so that the electrode films 408 and 412 appropriately fulfill their roles.

Preferably, the electrode films 408 and 412 are formed to cover up a region substantially contributing to the bending displacement of the piezoelectric/electrostrictive film 410. For example, the electrode films 408 and 412 are preferably formed to include a central portion of the piezoelectric/electrostrictive film 410 and to cover up a region that is 80% or more of the both principal surfaces of the piezoelectric/electrostrictive film 410.

4.4 Substrate 404

While a material of the substrate 404 is ceramics, a type of the ceramics is not limited to a specific one. Nonetheless, in view of heat resistance, chemical stability and insulating properties, the material of the substrate 404 is ceramics containing at least one type of ceramics selected from the group consisting of zirconium oxide, aluminum oxide, magnesium oxide, mullite, aluminum nitride, silicon nitride and glass. Among these ceramics, stabilized zirconium oxide is preferable for the material of the substrate 404 in view of mechanical strength and tenacity. "Stabilized zirconium oxide" herein means zirconium oxide in which crystal phase transition is suppressed by adding a stabilizer and includes partially stabilized zirconium oxide besides the stabilized zirconium oxide.

Examples of the stabilized zirconium oxide include zirconium oxides containing 1 to 30 molar % of calcium oxide, magnesium oxide, yttrium oxide, ytterbium oxide, cerium oxide or a rare earth metal oxide as a stabilizer, respectively. The stabilized zirconium oxide is preferably the zirconium oxide containing the yttrium oxide as the stabilizer because of particularly high mechanical strength. A content of the yttrium oxide is preferably 1.5 to 6 molar %, more preferably 2 to 4 molar %. It is further preferable to contain 0.1 to 5 molar % of aluminum oxide in addition to the yttrium oxide. A crystal phase of the stabilized zirconium oxide may be in a mixture crystal system of a cubic system and a monoclinic system, a mixture crystal system of a tetragonal system and the monoclinic system, a mixture crystal system of the cubic system, the tetragonal system and the monoclinic system or the like. However, it is preferable that the main crystal phase is in the mixture crystal system of the tetragonal system and the cubic system or in the tetragonal system from viewpoints of mechanical strength, tenacity and durability.

A thickness of the substrate 404 is preferably 1 to 1000 µm, more preferably 1.5 to 500 µm, most preferably 2 to 200 µm. This is because a mechanical strength of the piezoelectric/electrostrictive actuator 402 tends to fall if the thickness of the substrate 404 is below this range. In addition, rigidity of the substrate 404 increases and the bending displacement caused by expansion or contraction of the piezoelectric/electrostrictive film 410 when voltage is applied tends to decrease if the thickness exceeds this range.

A surface shape of the substrate 404 (a shape of a surface on which the layered body 406 is fixedly attached) is not limited to a specific one and can be a triangular shape, a quadrangular (rectangular or square) shape, an elliptic shape or a circular shape. If the substrate 404 is triangular or quadrangular, the substrate 404 may be rounded. Alternatively, the surface shape of the substrate 404 may be a complex form of combinations of these basic shapes.

4.5 Outline of Method of Manufacturing Piezoelectric/Electrostrictive Actuator 402

For manufacturing the piezoelectric/electrostrictive actuator 402, the electrode film 408 is first formed on the substrate 404. The electrode film 408 can be formed by such a method as ion beam sputtering, vacuum evaporation, PVD (Physical Vapor Deposition), ion plating, CVD (Chemical Vapor Deposition), plating, aerosol deposition, screen printing, spraying, or dipping. Among these methods, the sputtering or the screen printing is preferably used to form the electrode film 408 in view of better bonding of the electrode film 408 to the substrate 404 and the piezoelectric/electrostrictive film 410. The formed electrode film 408 can be fixedly attached to the substrate 404 and the piezoelectric/electrostrictive film 410 by heat treatment.

Next, the piezoelectric/electrostrictive film 410 is formed on the electrode film 408. The piezoelectric/electrostrictive film 410 can be formed by such a method as ion beam, sputtering, vacuum evaporation, PVD, ion plating, CVD, plating, a sol-gel method, aerosol deposition, screen printing, spraying or dipping. Among these methods, the screen printing is preferably used to form the piezoelectric/electrostrictive film 410 since the piezoelectric/electrostrictive film 410 can be continuously formed with high accuracy in respect of a plane shape and the thickness.

The electrode film 412 is formed on the piezoelectric/electrostrictive film 410. The electrode film 412 can be formed similarly to the electrode film 408.

Thereafter, the substrate 404 on which the layered body 406 is formed is integrally fired. This firing accelerates sintering of the piezoelectric/electrostrictive film 410 and subjects the electrode films 408 and 412 to heat treatment.

Although it is preferable to perform the heat treatment on the electrode films 408 and 412 simultaneously with firing in view of productivity, this step does not discourage the heat treatment from being performed whenever the electrode films 408 and 412 are formed. Nevertheless, if the piezoelectric/electrostrictive film 410 is fired before the heat treatment on the electrode film 412, the electrode film 412 is subjected to the heat treatment at a lower temperature than a firing temperature of the piezoelectric/electrostrictive film 410.

After the end of the firing, the polarization and the aging treatment are performed, thus completing the piezoelectric/electrostrictive actuator 402.

5. Fifth Embodiment

A fifth embodiment of the present invention relates to a structure of a piezoelectric/electrostrictive actuator 502 that can be adopted in place of that of the piezoelectric/electrostrictive actuator 402 according to the fourth embodiment.

FIG. 11 is a pattern diagram of the piezoelectric/electrostrictive actuator 502 according to the fifth embodiment. FIG. 11 is a cross-sectional view of the multilayer piezoelectric/electrostrictive actuator 502.

As shown in FIG. 11, the piezoelectric/electrostrictive actuator 502 has a structure in which an electrode film 514, a piezoelectric/electrostrictive film 516, an electrode film 518, a piezoelectric/electrostrictive film 520 and an electrode film 522 are stacked on an upper surface of a substrate 504 in this order. The electrode films 514 and 518 present on both principal surfaces of the piezoelectric/electrostrictive film 516, respectively, are opposed to each other across the piezoelectric/electrostrictive film 516. The electrode films 518 and 522 present on both principal surfaces of the piezoelectric/electrostrictive film 520, respectively, are opposed to each other across the piezoelectric/electrostrictive film 520. A layered body 506 in which the electrode film 514, the piezoelectric/electrostrictive film 516, the electrode film 518, the piezoelectric/electrostrictive film 520 and the electrode film 522 are stacked is fixedly attached to the substrate 504. While FIG. 11 illustrates an instance in which the number of piezoelectric/electrostrictive films is two, three or more piezoelectric/electrostrictive films may be provided.

A thickness of the substrate 504 of the multilayer piezoelectric/electrostrictive actuator 502 is set so that a central portion 524 to which the layered body 506 is bonded is thinner than peripheral portions 526. This is intended to make bending displacement larger while maintaining a mechanical strength of the substrate 504. It is to be noted that the substrate 504 may be used in place of the substrate 404 in the single-layer piezoelectric/electrostrictive actuator 402.

The multilayer piezoelectric/electrostrictive actuator 502 can be manufactured similarly to the single-layer piezoelectric/electrostrictive actuator 402 except for increase in numbers of piezoelectric/electrostrictive films and electrode films to be formed.

6. Sixth Embodiment

A sixth embodiment of the present invention relates to a structure of a piezoelectric/electrostrictive actuator 602 that can be adopted in place of that of the piezoelectric/electrostrictive actuator 402 according to the fourth embodiment.

FIG. 12 is a pattern diagram of the piezoelectric/electrostrictive actuator 602 according to the sixth embodiment. FIG. 12 is a cross-sectional view of the multilayer piezoelectric/electrostrictive actuator 602.

As shown in FIG. 12, the piezoelectric/electrostrictive actuator 602 includes a substrate 604 that is repetition of the substrate 504 shown in FIG. 11 as a unit structure and a layered body 606 fixedly attached onto each of unit structures. The layered body 606 is similar to the layered body 506 according to the fifth embodiment.

The piezoelectric/electrostrictive actuator 602 can be manufactured similarly to the piezoelectric/electrostrictive actuator 402 except for increase in numbers of piezoelectric/electrostrictive films, electrode films and layered bodies to be formed.

7. Seventh Embodiment

A seventh embodiment of the present invention relates to a piezoelectric/electrostrictive actuator 702 using the piezoelectric/electrostrictive ceramics sintered body according to the first embodiment.

7.1 Overall Structure

Figure 14:
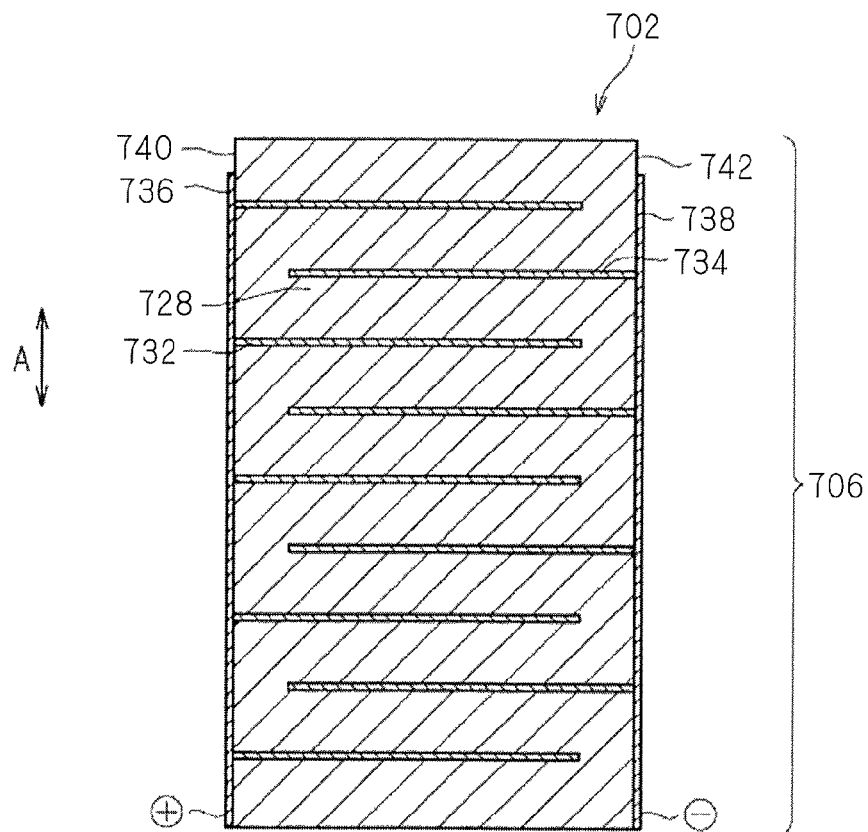
FIG. 14 is a longitudinal sectional view of the piezoelectric/electrostrictive actuator according to the seventh embodiment.
Figure 15:
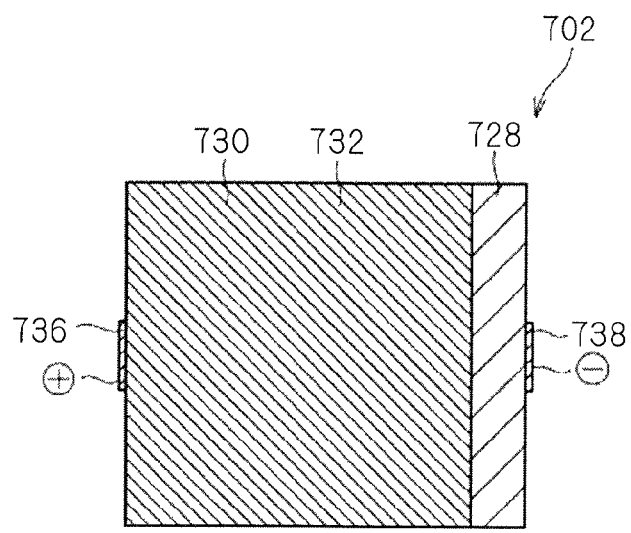
FIG. 15 is a cross-sectional view of the piezoelectric/electrostrictive actuator according to the seventh embodiment.

FIGS. 13 to 15 are pattern diagrams of the piezoelectric/electrostrictive actuator 702. FIG. 13 is a perspective view of the piezoelectric/electrostrictive actuator 702, FIG. 14 is a longitudinal sectional view of the piezoelectric/electrostrictive actuator 702 and FIG. 15 is a cross-sectional view of the piezoelectric/electrostrictive actuator 702.

Figure 16:
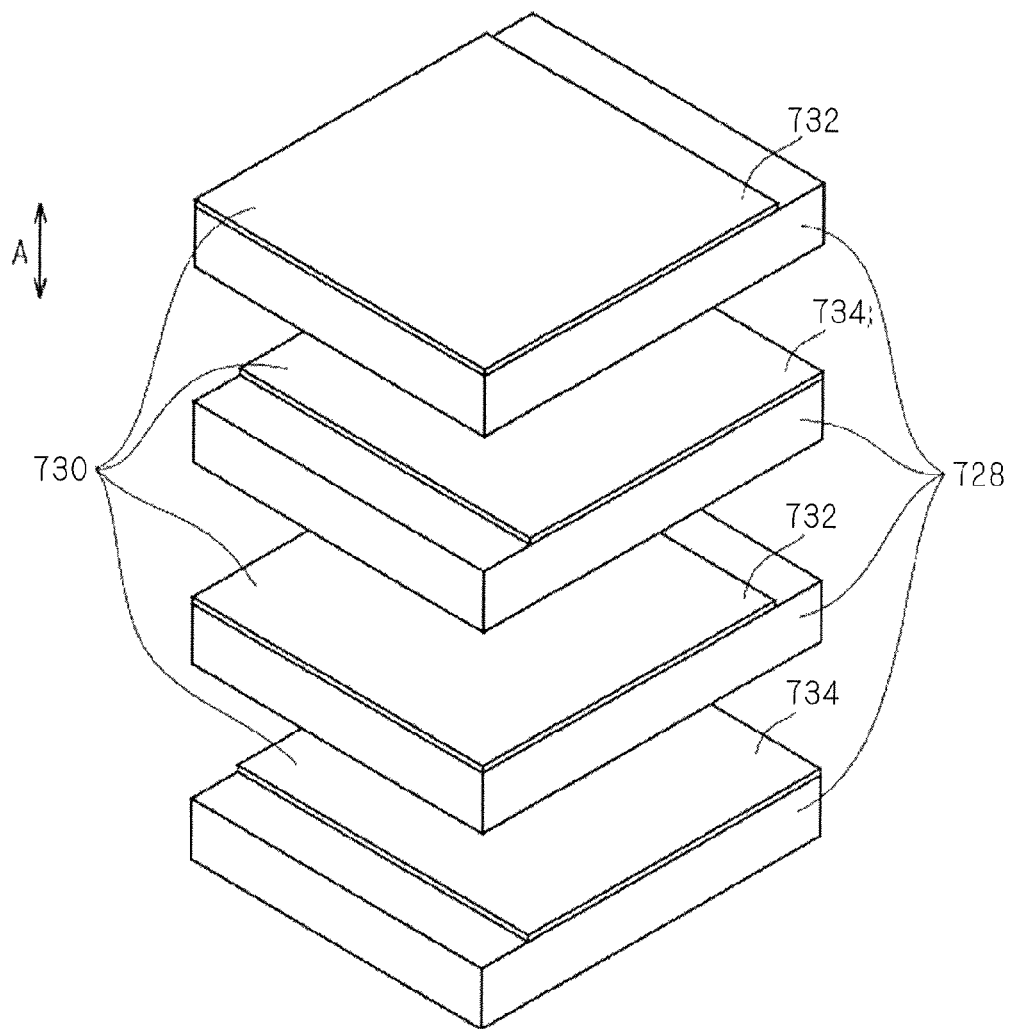
FIG. 16 is an exploded perspective view of a part of the piezoelectric/electrostrictive actuator according to the seventh embodiment.

As shown in FIGS. 13 to 15, the piezoelectric/electrostrictive actuator 702 is structured to alternately stack piezoelectric/electrostrictive films 728 and internal electrode films 730 in an A-axis direction, and to form external electrode films 736 and 738 on end surfaces 740 and 742 of a layered body 706 in which the piezoelectric/electrostrictive films 728 and the internal electrode films 730 are stacked, respectively. As shown in the exploded perspective view of FIG. 16 showing a state of exploding a part of the piezoelectric/electrostrictive actuator 702 in the A-axis direction, the internal electrode films 730 include first internal electrode films 732 that reach the end surface 740 but do not reach the end surface 742, and second internal electrode films 734 that reach the end surface 742 but do not reach the end surface 740. The first internal electrode films 732 and the second internal electrode films 734 are alternately provided. The first internal electrode films 732 are in contact with the external electrode film 736 on the end surface 740 and electrically connected to the external electrode film 736. The second internal electrode films 734 are in contact with the external electrode film 738 on the end surface 742 and electrically connected to the external electrode film 738. Accordingly, if the external electrode film 736 is connected to a positive side of a driving signal source and the external electrode film 738 is connected to a negative side of the driving signal source, a driving signal is applied to the first internal electrode films 732 and the second internal electrode films 734 opposed to one another across the piezoelectric/electrostrictive film 728 and an electric field is applied in a thickness direction of the piezoelectric/electrostrictive film 728. As a result, the piezoelectric/electrostrictive film 728 expands or contracts in the thickness direction and the layered body 706 as a whole deforms into a shape indicated by a broken line in FIG. 13.

The piezoelectric/electrostrictive actuator 702 does not include a substrate to which the layered body 706 is fixedly attached unlike the piezoelectric/electrostrictive actuators 402, 502 and 602 already described above. Further, the piezoelectric/electrostrictive actuator 702 is often referred to as an "offset piezoelectric/electrostrictive actuator" since the first internal electrode films 732 and the second internal electrode films 734 different in pattern are alternately provided.

7.2 Piezoelectric/Electrostrictive Film 728

Each of the piezoelectric/electrostrictive films 728 is constituted using the piezoelectric/electrostrictive ceramics sintered body according to the first embodiment. A thickness of each piezoelectric/electrostrictive film 728 is preferably 5 to 500 μm. This is because it is difficult to manufacture a green sheet to be described later if the thickness is below this range. In addition, it is difficult to apply a sufficient electric field to each of the piezoelectric/electrostrictive films 728 if the thickness exceeds this range.

7.3 Internal Electrode Films 730 and External Electrode Films 736 and 738

A material of each of the internal electrode films 730 and the external electrode films 736 and 738 is a metal such as platinum, palladium, rhodium, gold or silver, or an alloy thereof. Among these metals, the material of the internal electrode films 730 is preferably platinum or an alloy containing platinum as a main component because of high heat resistance during firing and easiness to sinter the internal electrode films 730 along with the piezoelectric/electrostrictive films 728. Alternatively, a silver-palladium alloy or the like can be suited to be used as the material of the internal electrode films 730 and the external electrode films 736 and 738 depending on the firing temperature.

A thickness of each of the internal electrode films 730 is preferably equal to or smaller than 10 μm. This is because the electrode films 730 function as buffer layers and displacement tends to be small if the thickness exceeds this range. It is also preferable that the thickness is equal to or larger than 0.1 μm so that the electrode films 730 appropriately fulfill their roles.

While FIGS. 13 to 15 illustrate an instance in which the number of piezoelectric/electrostrictive films 728 is ten, the number of piezoelectric/electrostrictive films 728 may be equal to or smaller than nine or equal to or larger than eleven.

7.4 Outline of Method of Manufacturing Piezoelectric/Electrostrictive Actuator 702

For manufacturing the piezoelectric/electrostrictive actuator 702, a binder, a plasticizer, a disperser and a dispersion medium are added to piezoelectric/electrostrictive ceramics powder, and the additives and the piezoelectric/electrostrictive ceramics powder are mixed with a ball mill or the like. A slurry obtained by mixing is formed into a sheet shape by a doctor blade method or the like, thereby obtaining green sheets.

The green sheets are subjected to blanking using a punch or a die, thereby forming holes for positioning or the like in the green sheets.

An electrode paste is coated onto surfaces of the green sheets by screen printing or the like, thus obtaining green sheets in each of which an electrode paste pattern is formed. The electrode paste pattern includes a pattern of a first electrode paste that becomes the first internal electrode films 732 after firing and a pattern of a second electrode paste that becomes the second internal electrode films 734 after firing. Needless to say, only one type of the electrode paste pattern may be used and the green sheets may be turned by 180° alternately so that the internal electrode films 732 and 734 can be obtained after firing.

Next, the green sheets on which the pattern of the first electrode paste is formed and the green sheets on which the pattern of the second electrode paste is formed are alternately superimposed, and the green sheet on which no electrode paste is coated is superimposed on an uppermost green sheet. Thereafter, the superimposed green sheets are pressed in a thickness direction and pressure-bonded to one another. At this time, the green sheets are pressed so that positions of the positioning holes formed in the green sheets coincide. Further, at the time of pressure-bonding the superimposed green sheets, it is preferable to pressure-bond the green sheets while heating the green sheets by heating a die that is being used for pressure bonding.

The pressure-bonded green sheets obtained, as stated above, are baked and the obtained sintered body is worked by a dicing saw or the like, thereby making it possible to obtain the layered body 706. Moreover, the external electrode films 736 and 738 are formed on the end surfaces 740 and 742 of the layered body 706, respectively by firing, evaporation, sputtering or the like and the polarization and the aging treatment are performed on the resultant layered body 706, thereby completing the piezoelectric/electrostrictive actuator 702.

EXAMPLES

Examples that are specific applications of the embodiments will be described.

Comparative Example 1, and Examples 1 and 2

Figure 18:
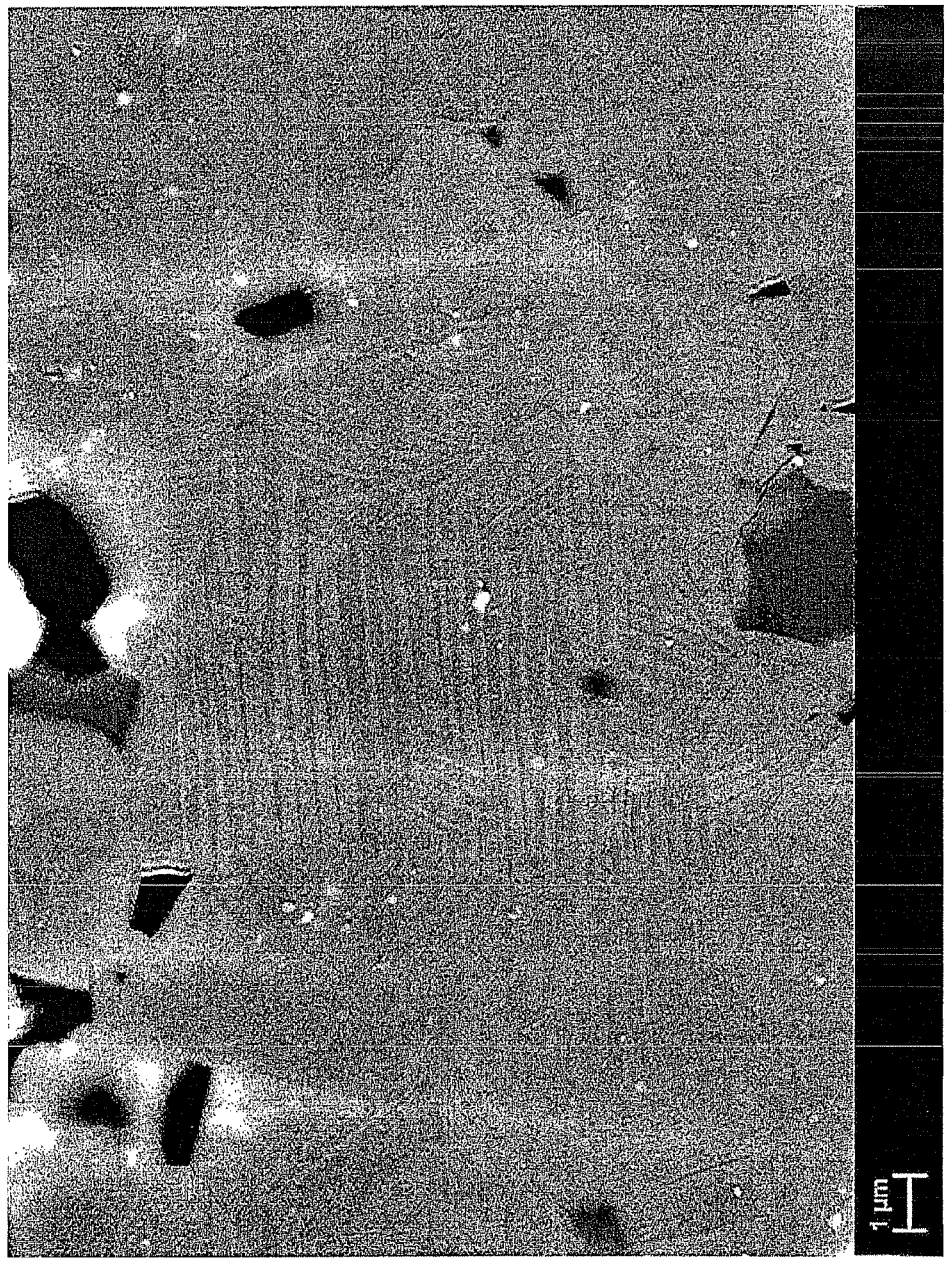
FIG. 18 is a cross-sectional FE-SEM photograph of a sample according to Comparative Example 1.
Figure 19:
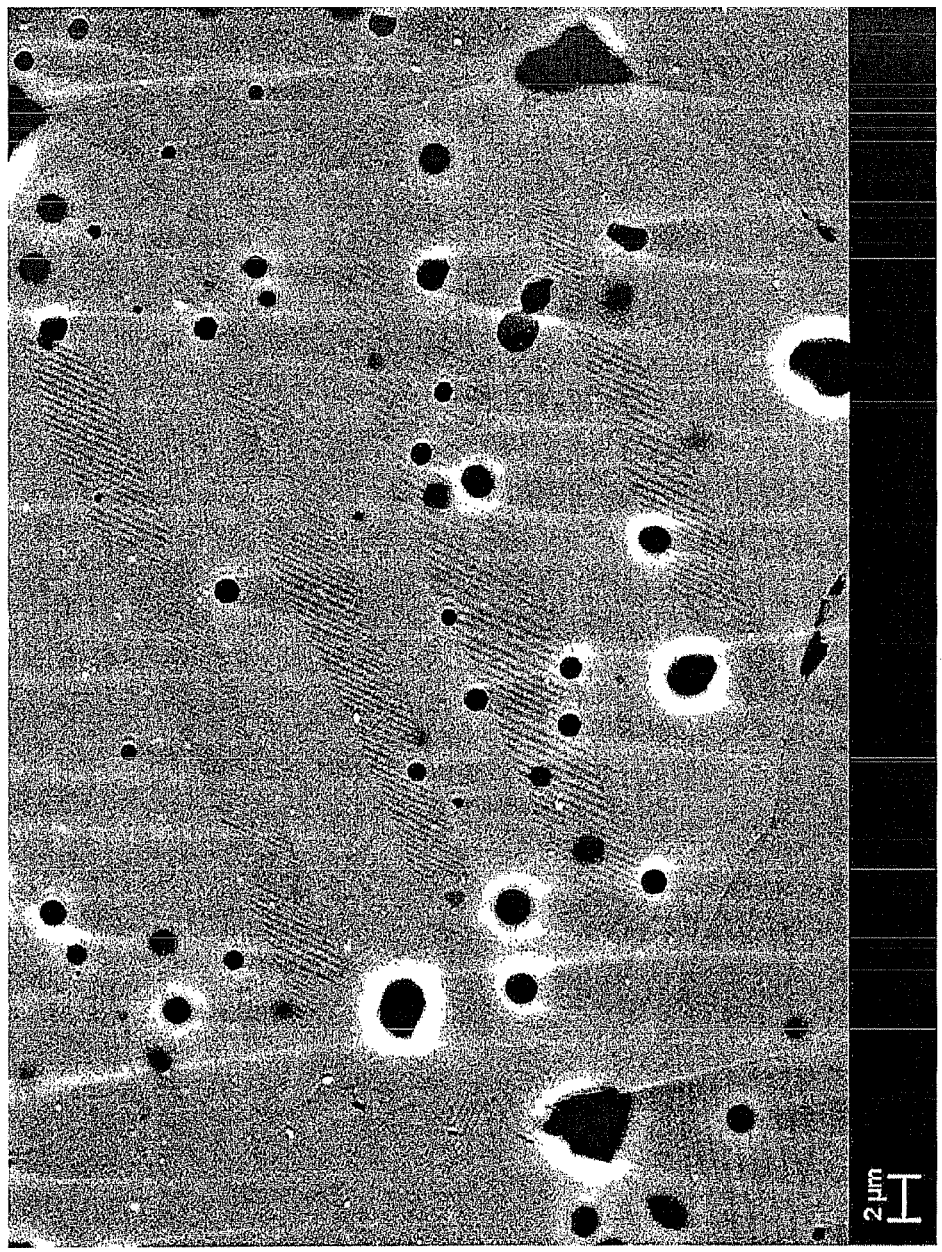
FIG. 19 is a cross-sectional FE-SEM photograph of a sample according to Example 2.

In Comparative Example 1, and Examples 1 and 2, the influence of presence, or absence, of the firing keep step and treatment conditions in the firing keep step on a piezoelectric/electrostrictive ceramics sintered body constituted by containing 0.02 molar parts of $MnO_2$ in 100 molar parts of the perovskite type oxide represented by the general formula $\{Li_y(Na_{1-x}K_x)_{1-y}\}_a(Nb_{1-z}Ta_z)O_3$ (x=0.45, y=0.06, z=0.082 and a=1.01) was examined. FIG. 17 shows a result of the examination. Items examined are the diffuse scattering intensity ratio, the degree of c-axis orientation, the ratio of the Banded structure occupying in grains, the width of the non-180° domains, a relative dielectric constant c, a piezoelectric constant $d_{31}$ (pm/V), a dielectric loss tan δ (%) and a electric-field-induced strain $S_{4000}$ (ppm). In FIG. 17, out of the two numeric values depicted in each of blocks of the width of the non-180° domains in Examples 1 and 2, the upper numeric value indicates the width of the non-180° domains that do not constitute the Banded structure and the lower numeric value indicates the width of the non-180° domains that constitute the Banded structure. Further, FIGS. 18 and 19 show cross-sectional FE-SEM photographs of samples in Comparative Example 1 and Example 2, respectively.

In each of Comparative Example 1, and Examples 1 and 2, piezoelectric/electrostrictive ceramics powder with a spherical particle shape and diameter of 0.2 to 0.5 μm was formed into pellets and sintered. A heating rate and a cooking rate of the firing profile were 200° C. per hour, respectively, a highest temperature was 970° C. and time for keeping the height temperature was three hours.

Thereafter, a pelletized piezoelectric/electrostrictive ceramics sintered body was machined into a strip, the strip sample was subjected to heat treatment in the air, and machining stress was eliminated from the sample. The heat treatment was performed at 600° C. for one hour.

Furthermore, the sample was immersed in silicon oil and subjected to polarization. The polarization was performed by applying an electric field of 5 kV/mm to the sample for 15 minutes.

Using the sample obtained as stated above, electric characteristics, that is, the relative dielectric constant ∈, the piezoelectric constant $d_{31}$ (pm/V), the dielectric loss tan δ(%) and the electric-field-induced strain $S_{4000}$ (ppm) were evaluated. The electric-field-induced strain $S_{4000}$ (ppm) indicates a strain amount in a longitudinal direction perpendicular to an electric field when the electric field of 4 kV/mm was applied to the sample. Furthermore, after evaluating the electrical characteristics, X-ray diffraction profiles of both of front and rear surfaces of the sample were measured and the degree of c-axis orientation and the diffuse scattering intensity ratio were calculated using the calculation method according to the second embodiment. Moreover, after evaluating the electric characteristics, the sample was subjected to CP polishing and a domain structure of the sample was observed based on a reflected electron image using a field emission scanning electron microscope (FE-SEM).

As shown in FIG. 17, in Comparative Example 1 in which the firing keep step was not executed, the diffuse scattering intensity ratio was higher than 0.5 and the Banded structure was not observed in the grains. In Examples 1 and 2 in each of which the firing keep step was executed, the diffuse scattering intensity ratio was equal to or lower than 0.5 and the Banded structure was observed in the grains. In addition, a width of bands constituting the Banded structure observed in each of Examples 1 and 2 was 1 to 10 μm.

As evident from a comparison of Example 1 with Example 2, the diffuse scattering intensity ratio can be further reduced and the ratio of the Banded structure occupying in grains can be further increased by increasing the time P1 for keeping the temperature equal to the first temperature T1 in the firing keeping step from three hours to ten hours.

As shown in FIG. 18, in Comparative Example 1 in which the firing keep step was not executed, non-180° domains having the width of 0.1 to 0.7 μm were observed. On the other hand, as shown in FIG. 19, in Example 2 in which the firing keep step was executed, not only non-180° domains having the width of 0.1 to 0.4 μm but also non-180° domains having the width of 1 to 10 μm and constituting a Herring bone Banded structure were observed. Further, in the non-180° domains constituting the Banded structure, stripes each at a width of 0.05 to 0.5 μm were observed.

As for the sample in Example 2, domains were subjected to crystal orientation analysis by an EBSD (Electron Backscattering Diffraction) method. FIGS. 20 to 26 show a result of the analysis.

Figure 20:
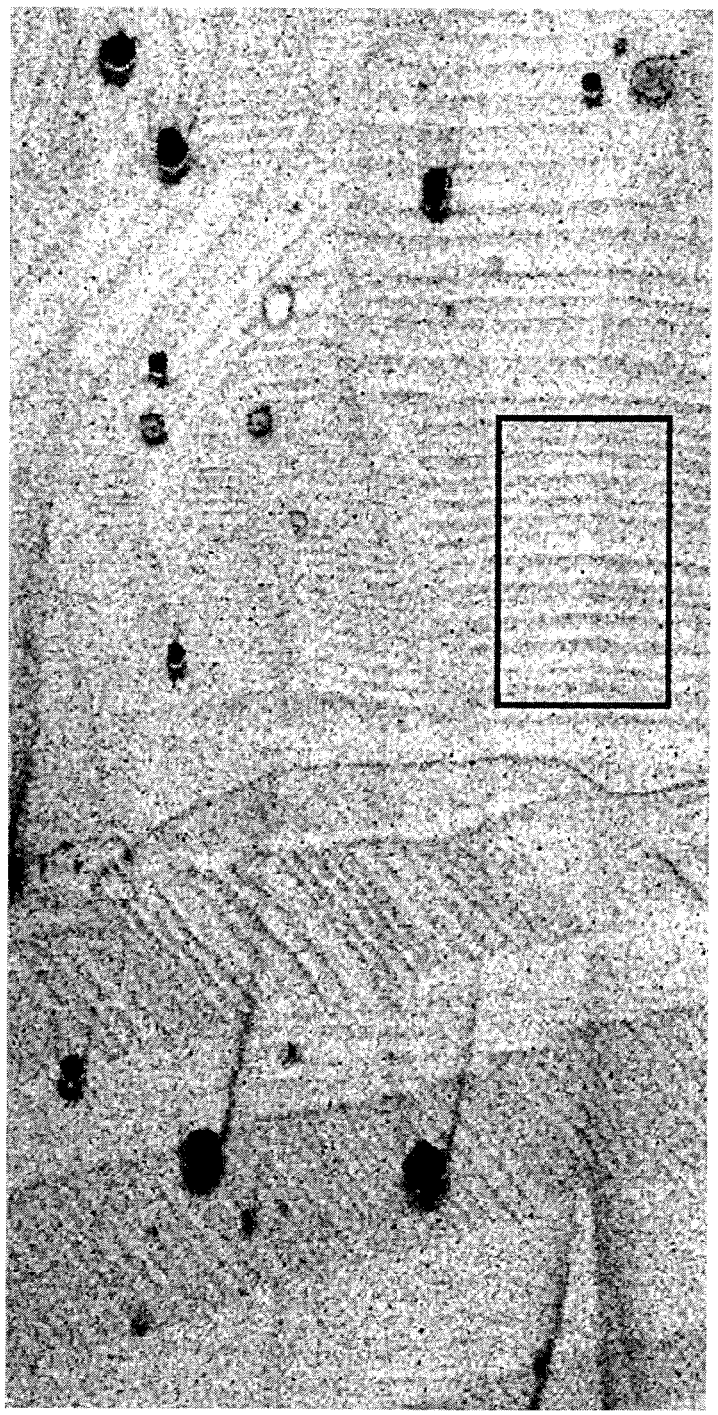
FIG. 20 is an IQ mapping image in a first field of view of a cross section of the sample according to Example 2.

FIG. 20 is a view showing an IQ (Image Quality) mapping image in a first field of view. FIG. 21 is a view showing mapping of fluctuation amounts within a rectangular region shown in FIG. 20 in crystal orientation. It was clear from FIGS. 20 and 21 that the stripes observed in the non-180° domains constituting the Banded structure indicated that the crystal orientation fluctuated from −2° to 2° in a cycle of 0.05 to 0.5 μm.

Figure 22:
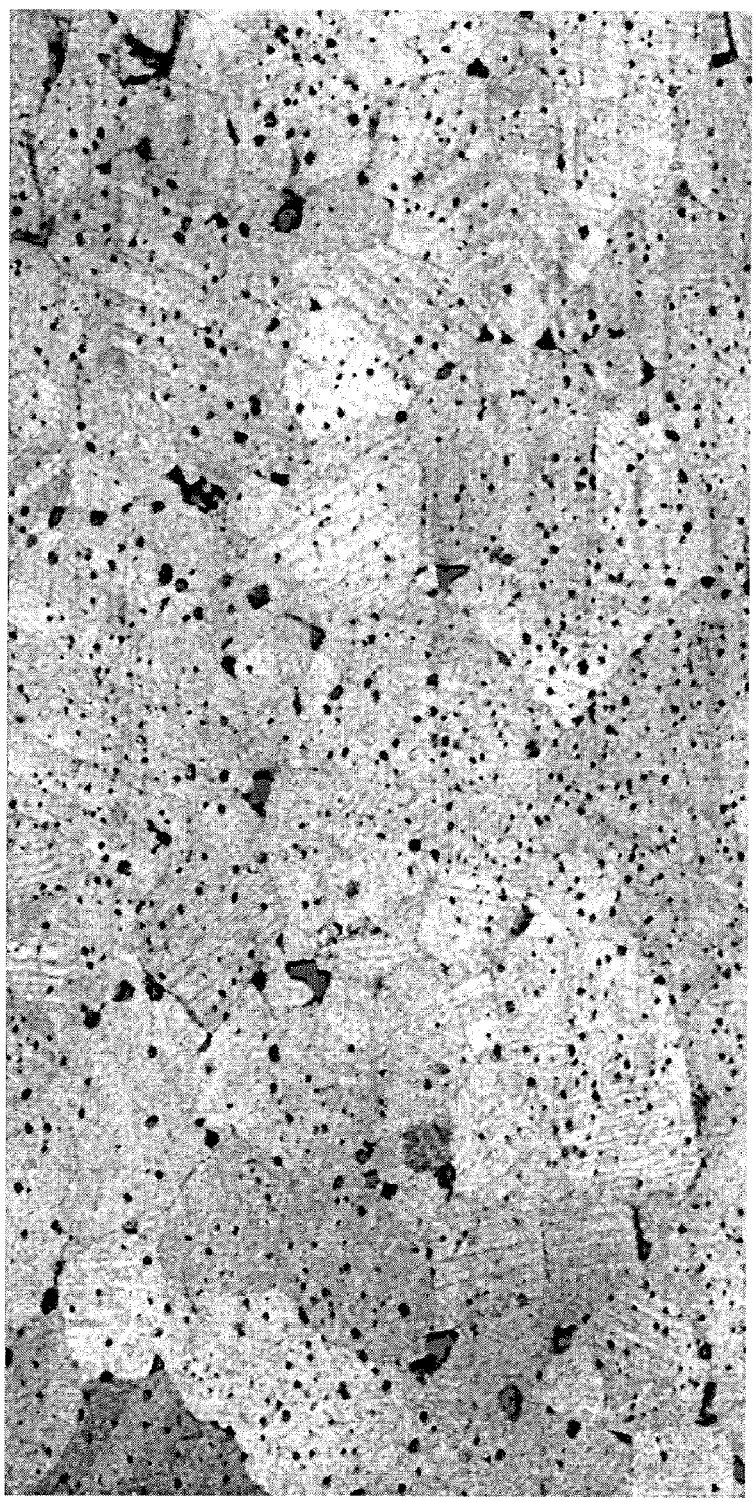
FIG. 22 is an IQ mapping image in a second field of view of the cross section of the sample according to Example 2.
Figure 23:
FIG. 23 is a drawing-substitute photograph of an IPF mapping image on an ND surface in the same field of view as that of the IQ mapping image shown in FIG. 22.
Figure 24:
FIG. 24 is a drawing-substitute photograph of an IPF mapping image on a TD surface in the same field of view as that of the IQ mapping image shown in FIG. 22.
Figure 25:
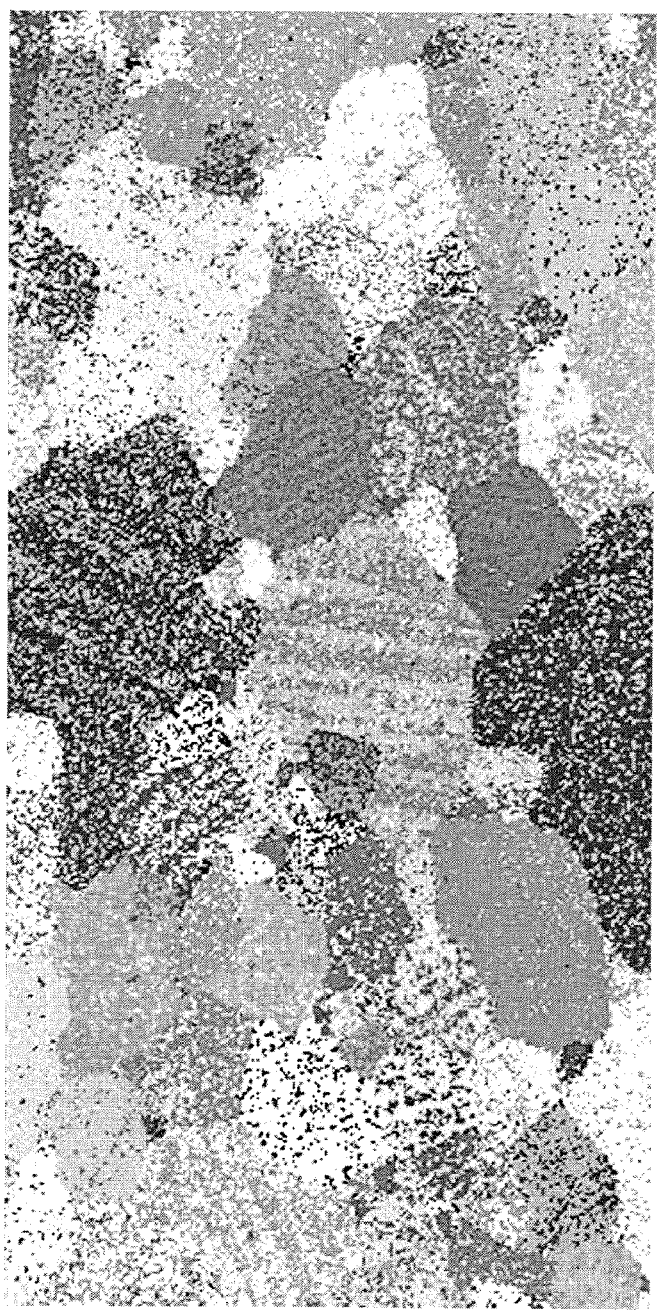
FIG. 25 is a drawing-substitute photograph of an IPF mapping image on an RD surface in the same field of view as that of the IQ mapping image shown in FIG. 22.
Figure 26:
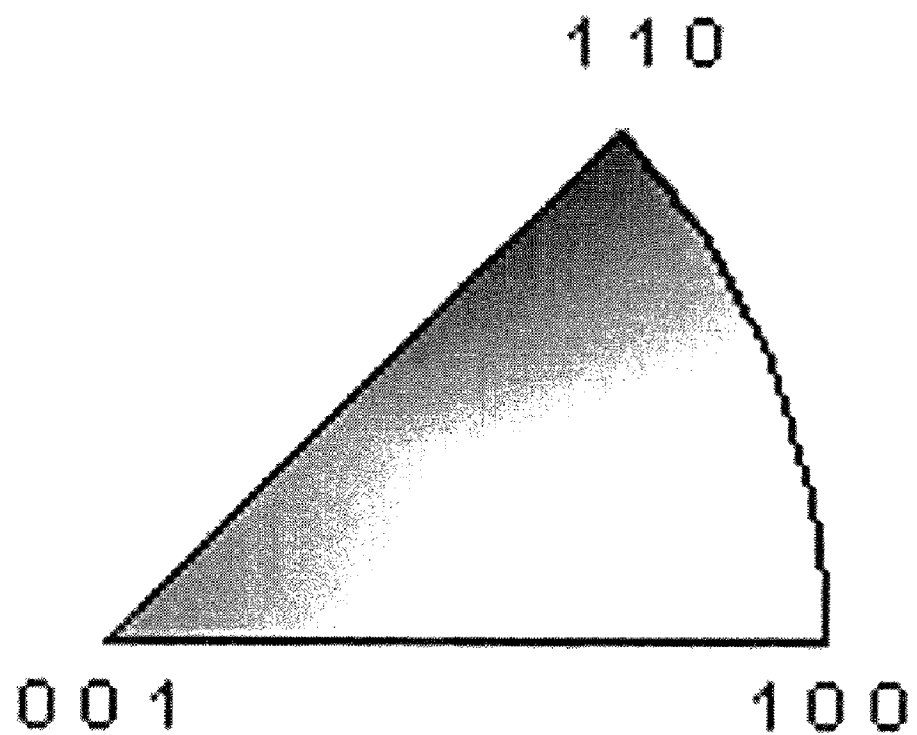
FIG. 26 is a drawing-substitute photograph of Color key of the IPF mapping images shown in FIGS. 23 to 25.

FIG. 22 is a view of an IQ mapping image in a second field of view of a cross-section of the sample in the second example. FIGS. 23 to 25 are views showing drawing-substitute photographs of IPF (Inverse Pole Figure) mapping images on an ND (Normal Direction) surface, on a TD (Transverse Direction) surface and on a RD (Reference Direction) surface in the same field of view as that of the IQ mapping image shown in FIG. 22, respectively. FIG. 26 is a view showing a drawing-substitute photograph of Color key of the IPF mapping images shown in FIGS. 23 to 25. It is clear from FIGS. 23 to 26, each of the bands constituting the Banded structure has an orientation relation to the adjacent band rotating by a range from 90+2° to 90−2° crystallographically.

Comparative Example 2, and Examples 3 to 7

Figure 28:
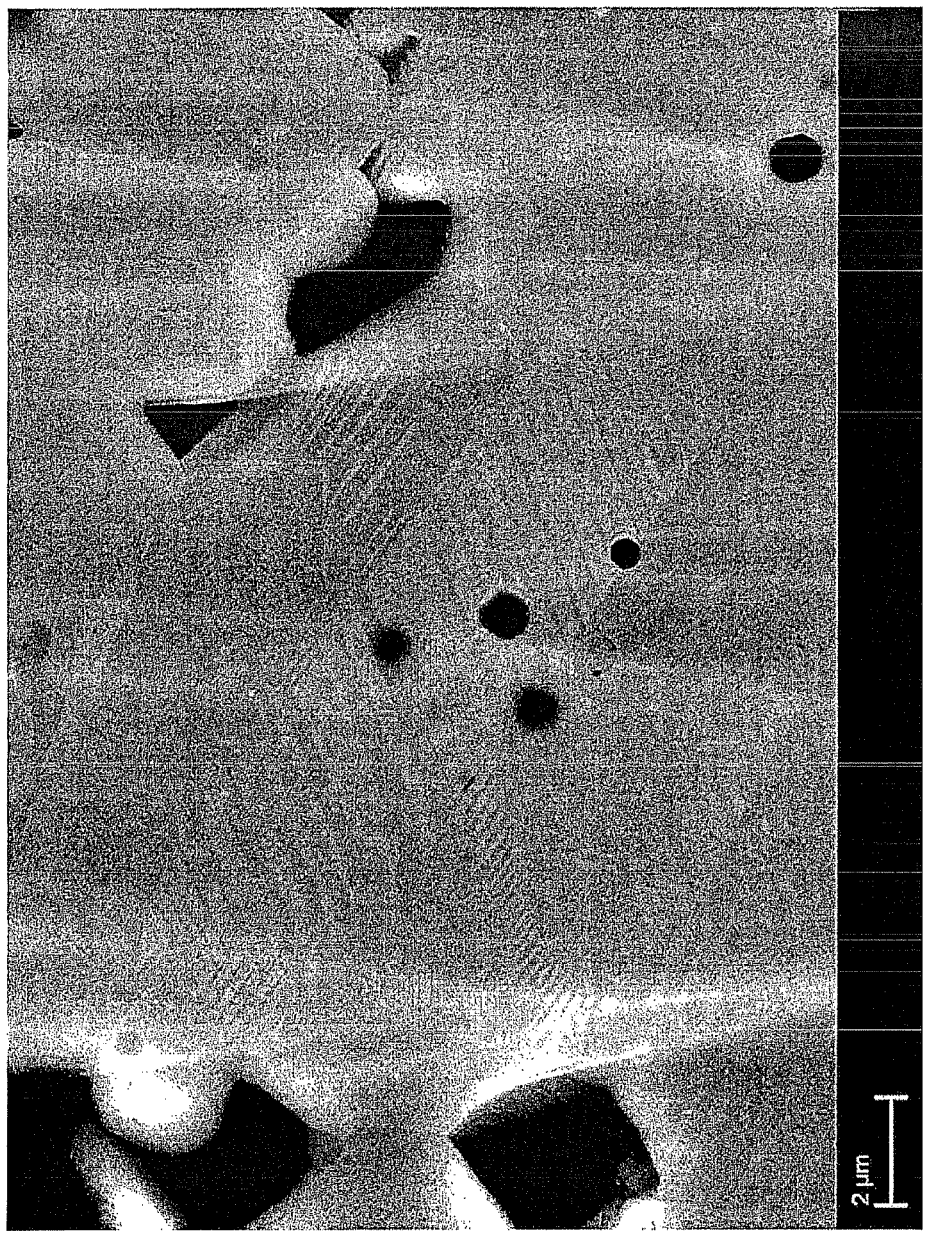
FIG. 28 is a view of a cross-sectional FE-SEM photograph of a sample in Example 4.

In Comparative Example 2, and Examples 3 to 7, the influence of presence, or absence, of the aging treatment, treatment conditions in the polarization, presence or absence of the firing keep step and treatment conditions in the aging treatment on a piezoelectric/electrostrictive ceramics sintered body constituted by containing 0.02 molar parts of $MnO_2$ in 100 molar parts of the perovskite type oxide represented by the general formula $\{Li_y(Na_{1-x}K_x)_{1-y}\}_a(Nb_{1-z-w}Ta_zSb_w)O_3$ (x=0.45, y=0.06, z=0.082, a=1.01 and w=0.04) was examined. FIG. 27 shows a result of the examination. Items examined are the same as those in Comparative Example 1, and Examples 1 and 2. FIG. 28 shows a cross-sectional FE-SEM photograph of a sample in Example 4.

In each of Comparative Example 2 and Examples 3 to 7, a sample was produced and evaluated similarly to Comparative Example 1, and Examples 1 and 2, except that a highest temperature during firing was changed to 980° C., a temperature in the firing keep step was changed to 880° C. and the aging treatment was performed on each of the samples in Examples 5 to 7.

As shown in FIG. 27, in Comparative Example 2 in which the firing keep step was not executed, the diffuse scattering intensity ratio was higher than 0.5 and the Banded structure was not observed in the grains. In Examples 3 to 7 in each of which the firing keep step was executed, the diffuse scattering intensity ratio was equal to or lower than 0.5 and the Banded structure was observed in the grains. In addition, the width of non-180° domains constituting the Banded structure observed in each of Examples 3 to 7 was 1 to 5

As evident from comparison of Example 3 with Example 4, the diffuse scattering intensity ratio can be further reduced and the ratio of the Banded structure occupying in the grains can be further increased by executing the high temperature polarization.

Furthermore, as evident from comparison of Example 4 with Examples 5 to 7, the diffuse scattering intensity ratio can be further reduced and the ratio of the Banded structure occupying in grains can be further increased by executing the high temperature aging treatment.

As shown in FIG. 28, in Example 4 in which the firing keep step and the high temperature polarization were executed, not only non-180° domains having a width of 0.1 to 0.8 μm, but also non-180° domains having a width of 1 to 4 μm, and constituting a Square net Banded structure were observed. Further, in the non-180° domains constituting the Banded structure, stripes with a width of 0.05 to 0.5 μm were observed.

Comparative Example 3 and Examples 8 to 12

In Comparative Example 3, and Examples 8 to 12, the influence of presence, or absence, of the firing keep step, treatment conditions in the polarization, presence or absence of the aging treatment and treatment conditions in the aging treatment on a piezoelectric/electrostrictive ceramics sintered body constituted by containing 0.05 molar parts of $MnO_2$ in 100 molar parts of the perovskite type oxide represented by the general formula $[\{Li_y(Na_{1-x}K_x)_{1-y}\}_{1-t}Bi_t]_a(Nb_{1-z}Ta_z)O_3$ (x=0.45, y=0.06, z=0.082, a=1.01 and t=0.0005) was examined. FIG. 29 shows a result of the examination and the items examined are the same as those in Comparative Example 1, and Examples 1 and 2.

In each of Comparative Example 3, and Examples 8 to 12, a sample was produced and evaluated similarly to Comparative Example 1, and Examples 1 and 2, except that the aging treatment is performed on each of the samples in Examples 10 to 12.

As shown in FIG. 29, in Comparative Example 3 in which the firing keep step was not executed, the diffuse scattering intensity ratio was higher than 0.5 and the Banded structure was not observed in the grains. In Examples 8 to 12 in each of which the firing keep step was executed, the diffuse scattering intensity ratio was equal to or lower than 0.5 and the Banded structure was observed in the grains. In addition, the width of non-180° domains constituting the Banded structure observed in each of Examples 8 to 12 was 1 to 10 μm.

As evident from comparison of Example 8 with Example 9, the diffuse scattering intensity ratio can be further reduced and the ratio of the Banded structure occupying in grains can be further increased by executing the high temperature polarization.

Furthermore, as evident from comparison of Example 9 with Examples 10 to 12, the diffuse scattering intensity ratio can be further reduced and the ratio of the Banded structure occupying in grains can be further increased by executing the high temperature aging treatment.

Comparative Example 4, and Examples 13 to 15

In Comparative Example 4, and Examples 13 to 15, influence of presence, or absence, of the firing keep step, treatment conditions in the polarization and presence or absence of the aging treatment on a piezoelectric/electrostrictive ceramics sintered body constituted by containing 0.02 molar parts of $MnO_2$ and 0.015 molar parts of $Bi_2O_3$ in 100 molar parts of the perovskite type oxide represented by the general formula $\{Li_y(Na_{1-x}K_x)_{1-y}\}_a(Nb_{1-z-w}Ta_zSb_w)O_3$ (x=0.45, y=0.06, z=0.082, a=1.01 and w=0.04) was examined. FIG. 30 shows a result of the examination and the items examined are the same as those in Comparative Example 1 and Examples 1 and 2.

In each of Comparative Example 4, and Examples 13 to 15, a sample was produced and evaluated similarly to Comparative Example 1, and Examples 1 and 2 except that a highest temperature during firing was changed to 1000° C., a temperature in the firing keep step was changed to 860° C. and the aging treatment was performed on the sample in Example 15.

As shown in FIG. 30, in Comparative Example 4 in which the firing keep step was not executed, the diffuse scattering intensity ratio was higher than 0.5 and the Banded structure was not observed in the grains. In Examples 13 to 15 in each of which the firing keep step was executed, the diffuse scattering intensity ratio was equal to or lower than 0.5 and the Banded structure was observed in the grains. In addition, the width of non-180° domains constituting the Banded structure observed in each of Examples 13 to 15 was 1 to 10 μm.

As evident from comparison of Example 13 with Example 14, the diffuse scattering intensity ratio can be further reduced and the ratio of the Banded structure occupying in grains can be further increased by executing the high temperature polarization.

Furthermore, as evident from comparison of Example 14 with Example 15, the diffuse scattering intensity ratio can be further reduced and the ratio of the Banded structure occupying in grains can be further increased by executing the high temperature aging treatment.

While the invention has been shown and described in detail, the foregoing description is in all aspects illustrative and not limited thereto. It is therefore understood that numerous modifications and variations can be devised without departing from the scope of the invention. Particularly, it is naturally assumed to use a combination of the items described in each embodiment. Furthermore, it is assumed to use the piezoelectric/electrostrictive ceramics sintered body in a piezoelectric/electrostrictive device such as a sensor other than the piezoelectric/electrostrictive actuator.

What is claimed is:

1. A piezoelectric/electrostrictive ceramics sintered body comprising:
    a perovskite type oxide serving as a main crystal phase, the perovskite type oxide containing at least one type of element selected from the group consisting of Li, Na and K as A site constituent elements, and at least one type of element selected from the group consisting of Nb and Ta as B site constituent elements, wherein a diffuse scattering intensity ratio is equal to or lower than 0.5, the diffuse scattering intensity ratio being a ratio of an intensity of diffuse scattering by a lattice-strained layer present near a domain wall to a sum of an X-ray diffraction intensity of a first lattice plane and an X-ray diffraction intensity of a second lattice plane different in interplanar spacing from the first lattice plane due to crystallographic symmetry reduction.

2. The piezoelectric/electrostrictive ceramics sintered body according to claim 1, wherein a degree of c-axis orientation on a surface perpendicular to a polarization direction is equal to or lower than 3.

3. The piezoelectric/electrostrictive ceramics sintered body according to claim 1, wherein a composition of main components is represented by a general formula $\{Li_y(Na_{1-x}K_x)_{1-y}\}_a(Nb_{1-z}Ta_z)O_3$ and satisfies $0.9 \leq a \leq 1.1$, $0.2 \leq x \leq 0.8$, $0.0 \leq y \leq 0.1$ and $0.0 \leq z \leq 0.5$.

4. The piezoelectric/electrostrictive ceramics sintered body according to claim 1, wherein a composition of main components is represented by a general formula $\{Li_y(Na_{1-x}K_x)_{1-y}\}_a(Nb_{1-z-w}Ta_zSb_w)O_3$ and satisfies $0.9 \leq a \leq 1.1$, $0.2 \leq x \leq 0.8$, $0.0 \leq y \leq 0.1$, $0.0 \leq z \leq 0.5$ and $0 < w \leq 0.1$.

5. The piezoelectric/electrostrictive ceramics sintered body according to claim 1, wherein a composition of main components is represented by a general formula $[\{Li_y(Na_{1-x}K_x)_{1-y}\}_{1-t}Bi_t]_a(Nb_{1-z}Ta_z)O_3$ and satisfies $0.9 \leq a \leq 1.1$, $0.2 \leq x \leq 0.8$, $0.0 \leq y \leq 0.1$, $0.0 \leq z \leq 0.5$ and $0.0 < t \leq 0.1$.

6. The piezoelectric/electrostrictive ceramics sintered body according to claim 1, wherein a composition of main components is represented by a general formula $\{Li_y(Na_{1-x}K_x)_{1-y}\}_a(Nb_{1-z-w}Ta_zSb_w)O_3$ and satisfies $0.9 \leq a \leq 1.1$, $0.2 \leq x \leq 0.8$, $0.0 \leq y \leq 0.1$, $0.0 \leq z \leq 0.5$ and $0 < w \leq 0.1$, and the piezoelectric/electrostrictive ceramics sintered body includes an accessory component $Bi_2O_3$, a content of the accessory component $Bi_2O_3$ with respect to 100 molar parts of the main components is equal to or lower than 0.05 molar parts.

7. The piezoelectric/electrostrictive ceramics sintered body according to claim 1, further containing at least one type of metallic element selected from the group consisting of Ag, Mn, Cr, Fe, Co, Ni, Cu and Zn.

8. The piezoelectric/electrostrictive ceramics sintered body according to claim 7, wherein a content of the at least one type of metallic element selected from the group consisting of Ag, Mn, Cr, Fe, Co, Ni, Cu and Zn with respect to 100 molar parts of the main components is equal to or lower than 3 molar parts.

9. The piezoelectric/electrostrictive ceramics sintered body according to claim 1, wherein the piezoelectric/electrostrictive ceramics sintered body has a Banded structure in which each of bands forms, together with an adjacent band, a non-180° domain structure.

10. The piezoelectric/electrostrictive ceramics sintered body according to claim 9, wherein the piezoelectric/electrostrictive ceramics sintered body has a Banded structure, the Banded structure being at least one of a Herring bone structure in which the bands are arranged in one direction and a Square net structure in which the bands are arranged in two directions.

11. The piezoelectric/electrostrictive ceramics sintered body according to claim 9, wherein crystal orientation in a domain within each of the bands that constitute the Banded structure fluctuates from −2° to 2° in a cycle of 0.05 to 0.5 μm.

12. The piezoelectric/electrostrictive ceramics sintered body according to claim 1, wherein a width of a band constituting a Banded structure is 1 to 10 μm.

13. The piezoelectric/electrostrictive ceramics sintered body according to claim 1, wherein an area ratio of a Banded structure occupying in grains is 4 to 80% in a cross-section.

* * * * *